(12) United States Patent
Song et al.

(10) Patent No.: US 12,103,270 B2
(45) Date of Patent: Oct. 1, 2024

(54) FLEXIBLE DISPLAY DEVICE AND METHOD FOR MANUFACTURING COVER THEREOF

(71) Applicant: LG ELECTRONICS INC., Seoul (KR)

(72) Inventors: In Su Song, Seoul (KR); Min Soo Kim, Seoul (KR); Sung Gab Kim, Seoul (KR); Seung Yeop Song, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/923,304

(22) PCT Filed: May 18, 2020

(86) PCT No.: PCT/KR2020/006499
§ 371 (c)(1),
(2) Date: Nov. 4, 2022

(87) PCT Pub. No.: WO2021/235564
PCT Pub. Date: Nov. 25, 2021

(65) Prior Publication Data
US 2023/0234338 A1    Jul. 27, 2023

(51) Int. Cl.
*B32B 17/10*      (2006.01)
*B32B 7/12*      (2006.01)
*B32B 27/08*      (2006.01)
*B32B 27/36*      (2006.01)
(Continued)

(52) U.S. Cl.
CPC ............... *B32B 17/10* (2013.01); *B32B 7/12* (2013.01); *B32B 27/08* (2013.01); *B32B 27/36* (2013.01);
(Continued)

(58) Field of Classification Search
CPC ........... B32B 7/12; B32B 17/10; B32B 27/08; B32B 27/36; B32B 33/00; B32B 37/02;
(Continued)

(56) References Cited

U.S. PATENT DOCUMENTS

2020/0095469 A1    3/2020    Yu et al.
2021/0240294 A1*    8/2021    Ko ..................... G06F 3/0416

FOREIGN PATENT DOCUMENTS

JP      2012230304 A   *   11/2012
JP      2015-68909 A      4/2015
(Continued)

OTHER PUBLICATIONS

Machine Translation of JP 2015-068909 A (Year: 2015).*
Machine Translation of JP 2012-230304 A (Year: 2012).*

*Primary Examiner* — Christopher M Polley
*Assistant Examiner* — Sathavaram I Reddy
(74) *Attorney, Agent, or Firm* — Birch, Stewart, Kolasch & Birch, LLP

(57) ABSTRACT

Disclosed are a display device and a method for manufacturing a cover thereof. A method for manufacturing a cover of a display device comprises: (a) a step in which a BM printing layer is formed on the front surface of a transparent film, and a release film is attached thereto; (b) a step in which the release film is cut along the BM printing layer; (c) a step in which the release film attached to the front surface of the transparent film is removed; (d) a step in which an abrasion-resistant coating layer is formed on the front surface of the transparent film; and (e) a step in which the release film attached to the BM printing layer is removed.

5 Claims, 15 Drawing Sheets

(51) Int. Cl.
  *B32B 33/00* (2006.01)
  *B32B 37/02* (2006.01)
  *B32B 38/00* (2006.01)
  *B32B 43/00* (2006.01)
  *G09F 9/30* (2006.01)
  *H05K 5/03* (2006.01)

(52) U.S. Cl.
  CPC .............. *B32B 33/00* (2013.01); *B32B 37/02* (2013.01); *B32B 38/145* (2013.01); *B32B 43/003* (2013.01); *B32B 43/006* (2013.01); *G09F 9/301* (2013.01); *H05K 5/03* (2013.01); *B32B 2307/4023* (2013.01); *B32B 2307/412* (2013.01); *B32B 2310/0843* (2013.01)

(58) Field of Classification Search
  CPC ... B32B 38/145; B32B 43/003; B32B 43/006; B32B 2307/4023; B32B 2307/412; B32B 2310/0843; G09F 9/301; H05K 5/03
  See application file for complete search history.

(56) References Cited

FOREIGN PATENT DOCUMENTS

| | | | | |
|---|---|---|---|---|
| JP | 2015068909 | A * | 4/2015 | |
| KR | 10-1557307 | B1 | 10/2015 | |
| KR | 10-2018-0115850 | A | 10/2018 | |
| KR | 10-1993390 | B1 | 6/2019 | |
| KR | 10-2019-0124009 | A | 11/2019 | |
| WO | WO-2019209041 | A1 * | 10/2019 | ........... G06F 1/1624 |

* cited by examiner

FLEXIBLE DISPLAY DEVICE AND METHOD FOR MANUFACTURING COVER THEREOF

CROSS REFERENCE TO RELATED APPLICATIONS

This application is the National Phase of PCT International Application No. PCT/KR2020/006499, filed on May 18, 2020, which is hereby expressly incorporated by reference into the present application.

TECHNICAL FIELD

The present invention relates to a rollable type flexible display device and a method for manufacturing a cover covering a flexible display thereof.

BACKGROUND ART

With the development of flexible displays that are bendable while displaying image information thereon, studies are being conducted and developments are being made regarding a foldable type device in which a flexible display is applied to a device having two bodies and folding structures (for example, hinge units). In such a device, since the flexible display may be entirely disposed on the two bodies via a folding structure, a large sized display may be implemented in the device.

As another device using a flexible display, a rollable device having a structure in which a display is rolled has been studied and developed. In such a device, as the flexible display is rolled, the total size or area of the display may be reduced. Conversely, as the flexible display is unrolled, the size or area of the display may be increased.

As still another device using a flexible display, a device has been introduced in which, as the two bodies perform sliding movement relative to each other, the flexible display having a U-shape according to a curved middle part is modified such that an area of the display viewed from either side changes.

In this regard, Korean Patent Unexamined Publication No. 2019-0124009 (hereinafter, referred to as 'Prior Document 1') discloses a flexible display and an electronic device including the same. The electronic device of Prior Document 1 is configured to a flexible display, a first structure, and a second structure.

The second structure is coupled to the first structure to be slidable in one direction. The second structure slidably moves with respect to the first structure between an opening state and a closing state of the electronic device.

A display includes a first surface, a second surface, and a third surface. The first surface and the third surface form a plane. The second surface forms a curved surface. The first surface is exposed to a front surface of the electronic device. The third surface is exposed to a rear surface of the electronic device. The second surface is exposed to the front surface or the rear surface of the electronic device between the opening state and the closing state of the electronic device.

The second structure includes a second rear-surface plate covering at least a part of the third surface of the display. The second rear-surface plate covers the third surface. The second rear-surface plate includes a material that transmits light. A user may view the third surface of the display through the second rear-surface plate.

The second rear-surface plate and the third surface of the display are spaced apart from each other. When the opening state and the closing state of the electronic device are switched, tensile force or compression force acts on the display. When the compression force acts on the display, a small amount of flexion is generated in the display.

Therefore, when the compression force acts on the display, the second rear-surface plate (cover glass) and the third surface may contact each other. In this case, damage (scratch) by friction with the second rear-surface plate may be applied to the third surface.

Manufacturers of the flexible display device perform anti fingerprint (AF) coating for the cover glass in order to prevent the damage to the flexible display. The AF coating represents excellent anti scratch and a kinetic friction efficient (slip property). Therefore, the damage to the flexible display is minimized. The AF coating is performed by vacuum deposition or sputtering.

In general, a black matrix (BM) printing layer is formed in the cover glass of the flexible display. The BM print layer is formed along an edge of a back surface of the cover glass. The BM print layer blocks the transmission of light. Therefore, the light of the flexible display passes through the cover glass only inside the BM print layer.

The cover glass is bonding-coupled to a body of the flexible display device along the BM print layer. An AF coating layer has weak bonding coupling force. Therefore, the AF coating layer should not be formed in the BM print layer.

A conventional AF coating layer forming scheme of the cover glass is a scheme that prints a mask on the BM print layer, and then performs the AF coating for the mask, and peels the mask. However, a mask printing and peeling process generates an additional yield, which acts as a factor of raising a production unit price of the cover glass. Further, there is a problem in that the BM print layer is partially damaged upon mask printing.

Another conventional AF coating layer forming scheme of the cover glass is a scheme that forms the mask on the BM print layer through photolithography, and then performs the AF coating for the mask, and peels a dry-film resists (DFR) film.

However, complicated processes such as DFM film Lami, exposure, development, peeling processes, etc., are required, which act as the factor of raising the production unit price. Further, there is a problem in that both the BM print layer and the AF coating layer are peeled due to the use of a strong alkaline corrosion solution upon DFR peeling.

DISCLOSURE

Technical Problem

An object to be achieved by the present invention is to provide a flexible display device and a method for manufacturing cover therefor, which prevent damage (peeling) of a BM printing layer.

An object to be achieved by the present invention is to provide a flexible display device and a method for manufacturing cover therefor, which prevent damage (scratch) of a flexible display by damage (peeling) of an abrasion-resistant coating layer.

An object to be achieved by the present invention is to provide a flexible display device and a method for manufacturing cover therefor, which minimize additional yield generation according to forming of the abrasion-resistant coating layer.

Technical Solution

A cover manufacturing method of a flexible display device according to an exemplary embodiment of the present invention may include step (a), step (b), step (c), step (d), and step (e).

The flexible display device may be configured to include a body and a flexible display.

The body may be configured to include a first body, a second body, and a roller. The first body and the second body may be formed as plate forms parallel to each other.

The first body and the second body may be configured to move relatively to each other. The second body may be configured to reciprocatively move between the first state and the second state relatively to the first body.

The body may be configured to include a first frame, a second frame, a third frame, and a fourth frame.

The first frame and the second frame may be coupled to the first body. The third frame and the fourth frame may be coupled to the second body.

The roller may be coupled to the second body. The roller may move jointly with the second body relatively to the first body. The roller may be provided inside the flexible display device.

The roller allows the flexible display to be bent and direction-switched. The roller may be coupled to the second body in a form rotatable with the central axis as a rotational axis.

A part of the flexible display may be fixed to a front of the first body and the flexible display may be bent behind the second body over the roller. The flexible display may be configured to form a form when the second body moves relatively to the first body.

The flexible display may include a first area, a second area, and a third area.

The first area may be fixed to the front of the first body. The second area may be extended from the first area. A part of the second area may be bent over the roller. The third area may be extended from the second area at an opposite side to the first area. The second body may be configured to include a cover. The cover may be formed by a light transparent panel. The cover may include a transparent film, a BM printing layer, an abrasion-resistant coating layer, and a glass.

The cover may cover the flexible display behind the second body. The cover may cover the second area and the third area.

The cover may be spaced apart form a rear surface of the second body. When a first state and a second state are switched, a part of the flexible display may move between the rear surface of the second body and the cover.

The flexible display device may include a driving module. The driving module may move the second body relatively to the first body.

The driving module may be configured to include a driving motor, a rack, and a driving gear.

The driving motor may be coupled to the first body. The rack may be coupled to the second body. The driving gear may be rotated by the driving motor. The driving gear may engage with the rack.

When the second body moves toward the first body, a controller may gradually increase a rotational speed of the driving motor to minimize compression force which acts on the second area and the third area. Therefore, damage (scratch) of the second area and the third area due to friction with the cover may be suppressed.

Step (a) may be a step of forming the BM printing layer in and attaching a release film to a front surface of the transparent film.

The BM printing layer may form a closed strip form.

The transparent film may include a release film, an OCA film, an optical film, a PET film, and a BK tint layer.

In step (a) above, two or more BM printing layers may be formed on the front surface of the transparent film. Preferably, in step (a) above, multiple BM printing layers may be formed on the front surface of the transparent film. The multiple BM printing layers are formed on the front surface of the transparent film to shorten a production time of steps (a) and (b).

Step (b) may be a step of cutting the release film along the BM printing layer. A laser processing apparatus may be used for cutting the release film. In step (b) above, the existing process and equipment may be used as they are without adding supply chain management (SCM).

Step (b) includes step (b1) and step (b2).

Step (b1) above may be a step of forming a first cutting line in the release film along the BM printing layer. The first cutting line may form a closed strip form. The first cutting line may be formed along an outer edge of the BM printing layer.

In step (b1) above, the first cutting line may penetrate the release film, and the laser may cut both the BM printing layer and the transparent film.

Step (b2) above may be a step of forming a second cutting line in the release film along the BM printing layer. The second cutting line may form the closed strip form. The second cutting line may be formed along an inner edge of the BM printing layer.

The second cutting line may be positioned inside the first cutting line. Therefore, an internal between the first cutting lines may be larger than an interval between the second cutting lines.

When step (b) above is completed, the glass may be attached to a back surface of the transparent film. The transparent film may be attached to the glass by adhesive force of the OCA film.

Step (c) above may be a step of removing the release film attached to the front surface of the transparent film. When the release film attached to the transparent film is removed, the front surface of the transparent film may be exposed to an upper side between the BM printing layers. In this case, the release film attached to the BM printing layer may maintain an attached state.

Step (d) above may be a step of forming the abrasion-resistant coating layer on the front surface of the transparent film. AF coating may be performed by vacuum deposition or sputtering. In step (d) above, the existing process and equipment may be used as they are without adding supply chain management (SCM).

In step (d) above, the abrasion-resistant coating layer may be formed on the front surface of the transparent film and the front surface of the release film.

Step (e) above may be a step of removing the release film attached to the BM printing layer. In step (e) above, the release film attached between the first cutting line and the second cutting line may be removed.

The cover may be bonding-coupled to the second body, the third frame, and the fourth frame along the outer edge of the BM printing layer. The cover and the second body may be bonding-coupled by an adhesive layer. The adhesive layer may be formed along the outer edge of the BM printing layer.

The abrasion-resistant coating layer may be interposed between the transparent film and the back surface of the second body. The second cutting line may be positioned at a location closer to the inner edge of the BM printing layer than to the adhesive layer. Therefore, the abrasion-resistant coating layer may not be formed at the outer edge portion of the BM printing layer in which the adhesive layer is formed.

Advantageous Effects

By a flexible display device and a method for manufacturing cover therefore according to an exemplary embodiment of the present invention, an abrasion-resistant coating layer is formed on a front surface of a transparent film while an outer edge of a BM printing layer in which an adhesive layer is formed is covered by a release film, and physical or chemical deformation is blocked, to prevent coupling force between a cover and a body from being weakened due to damage to the BM printing layer.

By a flexible display device and a method for manufacturing cover therefore according to an exemplary embodiment of the present invention, the abrasion-resistant coating layer is formed on the front surface of the transparent film, and then the release film attached to the BM printing layer is cut and the cover is attached to a second body, a third frame, and a fourth frame, and the physical and chemical deformation of the abrasion-resistant coating layer is blocked, and as a result, even though the flexible display contacts the abrasion-resistant coating layer, damage (scratch) to the flexible display can be minimized.

By a flexible display device and a method for manufacturing cover therefore according to an exemplary embodiment of the present invention, the existing process and equipment are used as they are without adding supply chain management (SCM) in steps (a), (b), (c), (d), and (e) to suppress additional yield generation according to forming of the abrasion-resistant coating layer, thereby minimizing a production unit price of the cover.

DESCRIPTION OF DRAWINGS

FIG. 5a is a cross-sectional view schematically illustrating the flexible display device as a cross-sectional view taken along line A-A' of FIG. 3a.

FIG. 7a is a cross-sectional view schematically illustrating the flexible display device as a cross-sectional view taken along line C-C' of FIG. 3a.

FIG. 8a is a cross-sectional view schematically illustrating the flexible display device as a cross-sectional view taken along line E-E' of FIG. 3a.

DESCRIPTION OF MAIN REFERENCE NUMERALS OF DRAWINGS

Figure 1:
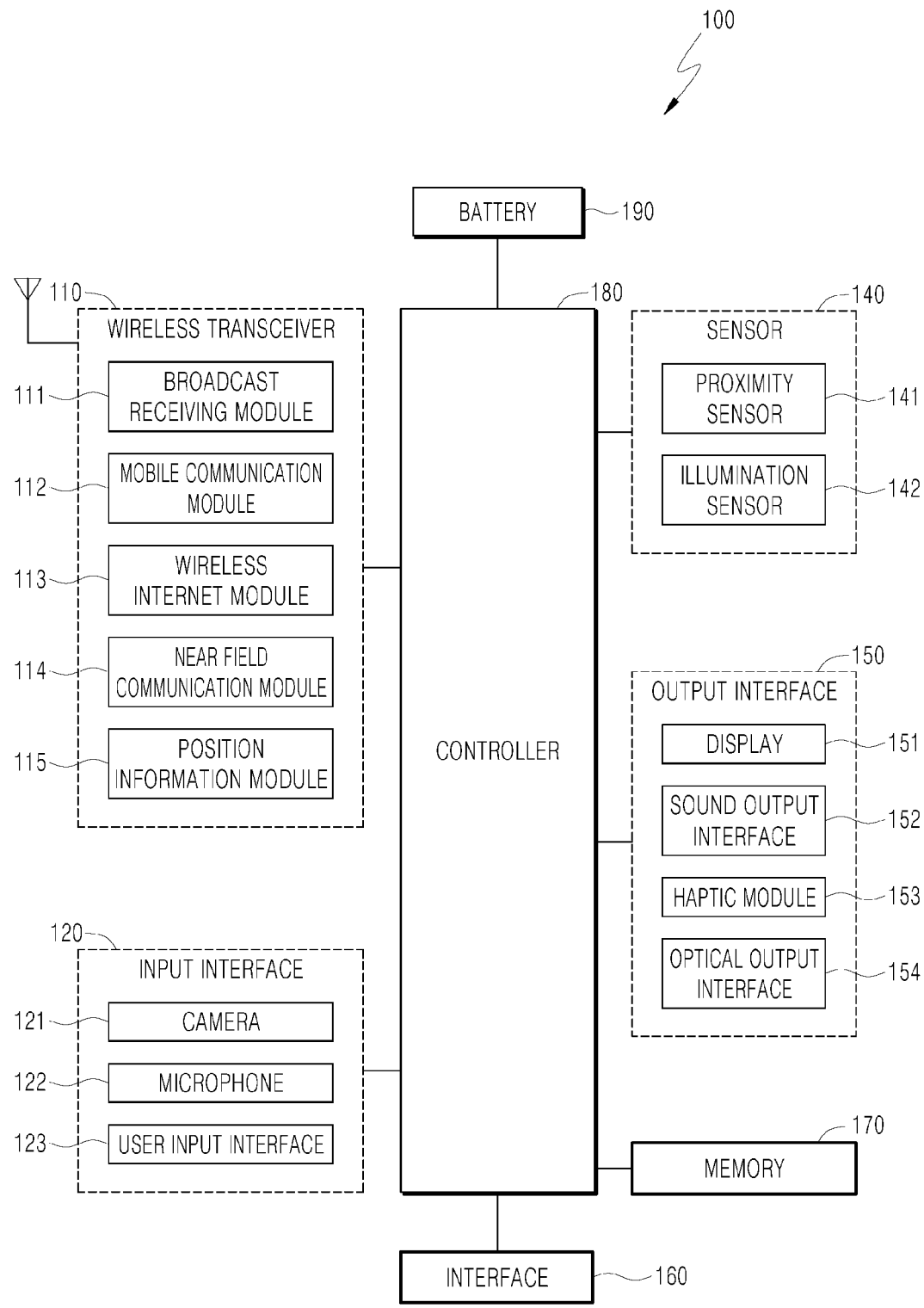
FIG. 1 is a block diagram for describing a flexible display device.

1: Flexible display device
121: Camera
300: Display
200: Body
310: First area
210: First body
320: Second area
211: First frame
321: First connection area
212: Second frame
322: Second connection area
220: Second body
b1: Dotted line
221: Third frame
C1: Curvature center line
221R: Rail
330: Third area
222: Fourth frame
340: Fourth area 230: Support body
400: Driving track
231: Center axis
410: Hinge segment
240: Fifth frame
500: Driving module
250: Cover
510: Rack
251: Transparent film
521,2: Driving motor
252: BM printing layer
531,2: Driving gear
253: Abrasion-resistant coating layer
1a: First surface
254: Glass
1b: Second surface
255: Release film
2: Vacuum deposition apparatus
256: OCA film
3a: Guide film
257: Optical film
3b: Clamp
258: PET film
3c: Silicon pad
259: Tint layer
3d: Adsorption pad
RF: Release film
L1: First cutting line
L2: Second cutting line
S100: Cover manufacturing method
S110: Form BM printing layer
S111: Attach release film
S120: Cut release film
S121: Attach glass
S130: Remove first release film
S140: Form abrasion-resistant coating layer
S150: Remove second release film Modes for the Invention Hereinafter, exemplary embodiments disclosed herein will be described in detail with reference to the accompanying drawings, and like reference numerals designate like elements, and redundant description thereof will be omitted. Suffixes "module" and "unit or portion" for elements used in the following description are merely provided for facilitation of preparing this specification, and thus they are not granted a specific meaning or function. Wherever possible, the same reference numbers will be used throughout the drawings to refer to the same or like parts. In the following description, known functions or structures, which may confuse the substance of the present disclosure, are not explained. The accompanying drawings are used to help easily explain various technical features and it should be understood that the exemplary embodiments presented herein are not limited by the accompanying drawings. As such, the present disclosure should be construed to extend to any alterations, equivalents and substitutes in addition to those which are particularly set out in the accompanying drawings.

Although the terms first, second, and the like, may be used herein to describe various elements, these elements should not be limited by these terms. These terms are generally only used to distinguish one element from another.

When an element or layer is referred to as being "on," "engaged to," "connected to," or "coupled to" another element or layer, it may be directly on, engaged, connected, or coupled to the other element or layer, or intervening elements or layers may be present. In contrast, when an element is referred to as being "directly on," "directly engaged to," "directly connected to," or "directly coupled to" another element or layer, there may be no intervening elements or layers present.

The singular expressions include plural expressions unless the context clearly dictates otherwise.

It should be understood that the terms "comprises," "comprising," "includes," "including," "containing," "has," "having" or any other variation thereof specify the presence of stated features, integers, steps, operations, elements, and/or components, but do not preclude the presence or addition of one or more other features, integers, steps, operations, elements, and/or components.

A flexible display device (hereinafter, referred to as a 'display device') described in the present specification may include a mobile terminal such as a portable phone, a smartphone, a laptop computer, a digital broadcasting terminal, a personal digital assistant (PDA), a portable multimedia player (PMP), a navigation, a slate PC, a tablet PC, an ultra-book, a wearable device, a smart watch, a smart glass, a head mounted display (HMD), and the like.

It will be apparent to those skilled in the art that the configuration according to the exemplary embodiment disclosed in the present specification may be applied to a fixed terminal such as a digital TV, a desktop computer, a digital signage except for an example that is applied only to a mobile terminal. Hereinafter, in the present disclosure, for the convenience of description, the mobile terminal will be first described as an example of the display device.

FIG. 1 is a block diagram for explaining a mobile terminal 100 according to the present disclosure.

The mobile terminal 100 may include, for example, a wireless transceiver 110, an input interface 120, a sensor 140, an output interface 150, an interface 160, a memory 170, a controller 180, and a power supply 190. The components shown in FIG. 1 are not essential to implement the mobile terminal, and the mobile terminal described in the present disclosure may include more or fewer components than the components described above.

More specifically, the wireless transceiver 110 may include one or more modules that enable wireless communication between the mobile terminal 100 and a wireless communication system, between the mobile terminal 100 and another mobile terminal 100, or between the mobile terminal 100 and an external server. Further, the wireless transceiver 110 may include one or more modules that connect the mobile terminal 100 to one or more networks.

The wireless transceiver 110 may include at least one of a broadcast receiving module 111, a mobile communication module 112, a wireless internet module 113, a near field communication module 114, or a position information module 115.

The input interface 120 may include a camera 122 or an image input interface that inputs an image signal, a microphone 121 or an audio input interface that inputs an audio signal, and a user input interface 123 (for example, a touch key or a mechanical key) that receives information from a user. Voice data or image data collected by the input interface 120 may be analyzed and processed as a control command of the user.

The sensor 140 may include one or more sensors that sense at least one of information in the mobile terminal, surrounding environment information around the mobile terminal, or user information. For example, the sensor 140 may include at least one of a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, an ultrasonic sensor, an optical sensor (for example, a camera 122), a microphone 121, a battery gauge, an environment sensor (for example, a barometer, a hygrometer, a thermometer, a radiation sensor, a thermal sensor, a gas sensor, etc.), or a chemical sensor (for example, an electronic nose, a healthcare sensor, and a biometric sensor). Further, the mobile terminal disclosed in the present specification may combine and utilize information sensed by at least two sensors from the above-mentioned sensors.

The output interface 150 generates outputs related to visual, auditory, or tactile senses, and may include at least one of a display 151, a sound output interface 152, a haptic module 153, or an optical output interface 154. The display 151 forms a mutual layered structure with a touch sensor, or is formed integrally to be implemented as a touch screen. The touch screen simultaneously may serve as a user input interface 123 that provides an input interface between the mobile terminal 100 and the user while providing an output interface between the mobile terminal 100 and the user.

The interface 160 serves as a passage between the mobile terminal 100 and various types of external devices that are connected to the mobile terminal 100. The interface 160 may include at least one of a wired/wireless headset port, an external charger port, a wired/wireless data port, a memory card port, a port for connecting a device equipped with an identification module, an audio input/output (I/O) port, a video input/output (I/O) port, or an earphone port. As the external device is connected to the interface 160, the mobile terminal 100 may perform appropriate control on the connected external device.

Further, the memory 170 may store data that supports various functions of the mobile terminal 100. The memory 170 may store a plurality of application programs (or applications) driven in the mobile terminal, and data and commands for operations of the mobile terminal 100. At least some of the application programs may be downloaded from an external server through wireless communication. Further, at least some of the application programs for the basic functions of the mobile terminal 100 (for example, functions for receiving and making calls and receiving and sending messages) may be provided in the mobile terminal 100 from the time of manufacture. The application programs may be stored in the memory 170, and may be installed on the mobile terminal 100 so as to be driven by the controller 180 to perform operations (or functions) of the mobile terminal.

In addition to the operations related to the application programs, the controller 180 may generally control overall operation of the mobile terminal 100. The controller 180 may process a signal, data, or information that is inputted or outputted through the above-described components or drive the application programs stored in the memory 170 to provide or process appropriate information or functions to the user.

Further, in order to drive the application programs stored in the memory 170, the controller 180 may control at least some of components described with reference to FIG. 1. Moreover, the controller 180 may combine and operate at least two of components included in the mobile terminal 100 to drive the application programs.

Under the control of the controller 180, the power supply 190 may be supplied with external power or internal power, and supply power to each component included in the mobile terminal 100. The power supply 190 includes a battery, which may be a built-in battery or a replaceable battery.

At least some of the above-described components may operate in cooperation with each other to implement the operation, the control, or the control method of the mobile terminal according to various embodiments which will be described below. Further, the operation, the control, or the control method of the mobile terminal may be implemented on the mobile terminal by driving at least one application program stored in the memory 170.

Hereinafter, prior to describing various embodiments implemented by the mobile terminal 100 described above, the above-mentioned components will be described in more detail with reference to FIG. 1.

First, the wireless transceiver 110 will be described. The broadcast receiving module 111 of the wireless transceiver 110 receives a broadcast signal and/or broadcast-related information from an external broadcast management server through a broadcast channel. The broadcast channel may include a satellite channel and a ground wave channel. Two or more broadcast receiving modules for simultaneous broadcast reception or broadcast channel switching for at least two broadcast channels may be provided to the mobile terminal 100.

The broadcast management sever may refer to a server that generates and transmits a broadcast signal and/or broadcast-related information or a server that is supplied with the previously generated broadcast signal and/or broadcast-related information to transmit the broadcast signal and/or the broadcast-related information to the terminal. The broadcast signal may include not only a TV broadcast signal, a radio broadcast signal, and a data broadcast signal, but also a broadcast signal obtained by combining the TV broadcast signal or the radio broadcast signal with the data broadcast signal.

The broadcast signal may be encoded according to at least one of technical standards (or broadcast schemes, for example, ISO, IEC, DVB, or ATSC) for transmitting and receiving a digital broadcast signal, and the broadcast receiving module 111 may receive the digital broadcast signal using an appropriate method for the technical specification defined by the technical standards.

The broadcast-related information may refer to information related to a broadcast channel, a broadcast program, or a broadcast service provider. The broadcast-related information may also be provided over the mobile communication network. In this case, the broadcast-related information may be received by the mobile communication module 112.

The broadcast-related information may exist in various types, such as an electronic program guide (EPG) of a digital multimedia broadcast (DMB) or an electronic service guide (ESG) of a digital video broadcast-handheld (DVB-H). The broadcast signal and/or the broadcast-related information received by the broadcast receiving module 111 may be stored in the memory 170.

The mobile communication module 112 may transmit/receive a wireless signal to/from at least one of a base station, an external terminal, or a server over a mobile communication network established according to the technical standards or communication methods for mobile communication (for example, Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), and Long Term Evolution-Advanced (LTE-A).)

The wireless signal may include a voice call signal, a video call signal, or various types of data in accordance with transmission or reception of a text/multimedia message.

The wireless internet module 113 refers to a module for wireless internet connection, and may be embodied in the mobile terminal 100 or installed at the outside of the mobile terminal 100. The wireless internet module 113 may be configured to transmit/receive a wireless signal over a communication network according to wireless internet technologies.

The wireless internet technologies include, for example, wireless LAN (WLAN), wireless fidelity (Wi-Fi), Wi-Fi direct, digital living network alliance (DLNA), wireless broadband (WiBro), world interoperability for microwave access (WiMAX), high speed downlink packet access (HSDPA), high speed uplink packet access (HSUPA), long term evolution (LTE), and long term evolution-advanced (LTE-A). The wireless internet module 113 may transmit or receive data in accordance with at least one wireless internet technology within a range including internet technology that have not been described above.

From the viewpoint that the wireless internet connection through, for example, WiBro, HSDPA, HSUPA, GSM, CDMA, WCDMA, LTE, and LTE-A is performed over the mobile communication network, the wireless internet module 113 that performs the wireless internet connection over the mobile communication network may be understood as a type of the mobile communication module 112.

The near field communication module 114 is for short range communication, and may support the short range communication using at least one of Bluetooth™, radio frequency identification (RFID), infrared data association (IrDA), ultra-wideband (UWB), ZigBee, Near Field Communication (NFC), wireless fidelity (Wi-Fi), Wi-Fi Direct, or Wireless Universal Serial Bus (Wireless USB). The near field communication module 114 may support wireless communication between the mobile terminal 100 and the wireless communication system, between the mobile terminal 100 and the other mobile terminal 100, or between the mobile terminal 100 and a network in which the other mobile terminal 100 (or external server) is located, over the wireless local area network. The wireless local area network may be a wireless personal area network.

Here, the other mobile terminal 100 may be a wearable device (for example, a smart watch, a smart glass, or a head mounted display (HMD)) that is capable of exchanging data (or interworking) with the mobile terminal 100 according to the present disclosure. The near field communication module 114 may detect (or recognize) the wearable device that is capable of communicating with the mobile terminal 100, in the vicinity of the mobile terminal 100. Moreover, when the detected wearable device is authenticated to communicate with the mobile terminal 100 according to the present disclosure, the controller 180 may transmit at least a portion of data processed in the mobile terminal 100 to the wearable device through the near field communication module 114. Therefore, the user of the wearable device may use the data processed in the mobile terminal 100, through the wearable device. For example, according to this, when a phone call is received by the mobile terminal 100, the user may make a phone call through the wearable device, or when a message is received by the mobile terminal 100, the user may check the received message through the wearable device.

The position information module 115 is a module for obtaining a position (or a current position) of a mobile terminal, and its representative examples include a global positioning system (GPS) module or a wireless fidelity (Wi-Fi) module. For example, when the GPS module is utilized, the mobile terminal may obtain the position of the mobile terminal using a signal transmitted from the GPS satellite. As another example, when the Wi-Fi module is utilized, the mobile terminal may obtain the position of the mobile terminal based on information on a wireless access point (AP) that transmits and receives wireless signals with the Wi-Fi module. If necessary, the position information module 115 may alternatively or additionally perform a function of another module of the wireless transceiver 110 to obtain data on the position of the mobile terminal. The position information module 115 is a module used to obtain the position (or the current position) of the mobile terminal, and is not limited to a module that directly calculates or obtains the position of the mobile terminal.

Next, the input interface 120 is for inputting video information (or signal), audio information (or signal), data, or information inputted by the user, and the mobile terminal 100 may include one or a plurality of cameras 122 to input the video information. The camera 122 processes an image frame such as a still or moving image obtained by an image sensor in a video call mode or a photographing mode. The processed image frame may be displayed on the display 151, or may be stored in the memory 170. Further, the plurality of cameras 122 included in the mobile terminal 100 may be arranged to form a matrix structure, and a plurality of pieces of image information having various angles or focal points may be inputted to the mobile terminal 100 through the cameras 122 that form the matrix structure. Further, the plurality of cameras 122 may be arranged to form a stereo structure to obtain left and right images used to implement a stereoscopic image.

The microphone 121 processes an external sound signal as electrical voice data. The processed voice data may be utilized in various manners in accordance with the function (or an application program that is being executed) that is being performed by the mobile terminal 100. Various noise removal algorithms for removing noise generated during the process of receiving the external sound signal may be implemented in the microphone 121.

The user input interface 123 is for receiving information from the user, and when the information is inputted through the user input interface 123, the controller 180 may control the operation of the mobile terminal 100 so as to correspond to the inputted information. The user input interface 123 may include a mechanical input interface (or a mechanical key, for example, a button, a dome switch, a jog wheel, and a jog switch that are located on a front, rear, or side surface of the mobile terminal 100) and a touch type input interface. For example, the touch type input interface may be formed as a virtual key, a soft key, or a visual key that is displayed on the touch screen through a software process, or a touch key that is disposed on a part other than the touch screen. The virtual key or visual key may be displayed on the touch screen in various shapes, and, for example, may be formed as graphics, text, icons, video, or a combination thereof.

The sensor 140 senses at least one of information in the mobile terminal, surrounding environment information around the mobile terminal, or user information, and generates a sensing signal corresponding to the information. The controller 180 may control the driving or the operation of the mobile terminal 100 or perform data processing, functions, or operations related to the application program installed in the mobile terminal 100, based on the sensing signal. Representative sensors among various sensors that may be included in the sensor 140 will be described in more detail below.

First, the proximity sensor 141 refers to a sensor that senses the presence of an object approaching a predetermined sensing surface or nearby objects, using an electromagnetic field force or infrared ray without any mechanical contact. The proximity sensor 141 may be disposed in an internal area of the mobile terminal that is enclosed by the above-described touch screen or in the vicinity of the touch screen.

Examples of the proximity sensor 141 may include, for example, a transmission type photoelectric sensor, a direct reflection type photoelectric sensor, a mirror reflection type photoelectric sensor, a high frequency oscillation type proximity sensor, a capacitive proximity sensor, a magnetic proximity sensor, and an infrared proximity sensor. When the touch screen is a capacitive type, the proximity sensor 141 may be configured to detect the proximity of an object with a change in the electric field in accordance with the proximity of the object having conductivity. In this case, the touch screen (or the touch sensor) itself may be classified as a proximity sensor.

For convenience of description, when the object approaches the touch screen without contacting the touch screen, and it is recognized that the object is located over the touch screen, it is referred to as a "proximity touch". When the object actually touches the touch screen, it is referred to as a "contact touch". A position at which the object proximately touches the touch screen refers to a position at which the object vertically corresponds to the touch screen when the object proximately touches the touch screen. The proximity sensor 141 may sense the proximity touch and a proximity touch pattern (for example, a proximate touch distance, a proximate touch direction, a proximate touch speed, a proximate touch time, a proximate touch position, and a proximate touch movement state). As described above, the controller 180 may process data (or information) corresponding to the proximate touch operation and the proximate touch pattern sensed by the proximity sensor 141, and may further display visual information corresponding to the processed data on the touch screen. Furthermore, the controller 180 may control the mobile terminal 100 to process different operations or data (or information) depending on whether the touch on the same point on the touch screen is the proximity touch or the contact touch.

The touch sensor senses a touch (or a touch input) applied to the touch screen (or the display 151) using at least one of various touch types such as a resistive film type, a capacitive type, an infrared type, an ultrasonic type, and a magnetic field type.

For example, the touch sensor may be configured to convert a change in a pressure applied to a specific portion of the touch screen, or a capacitance generated in a specific portion, into an electrical input signal. The touch sensor may be configured to detect a position and area where a touch subject that applies a touch onto the touch screen is touched on the touch sensor, and a pressure and capacitance at the time of the touch. Here, the touch subject is an object that applies a touch to the touch sensor, and may include, for example, a finger, a touch pen, a stylus pen, and a pointer.

As described above, when there is the touch input to the touch sensor, corresponding signal(s) is transmitted to a touch controller. The touch controller processes the signal(s) and then transmits corresponding data to the controller 180. By doing this, the controller 180 may confirm which area of the display 151 is touched. Here, the touch controller may be a separate component from the controller 180, or may be the controller 180 itself.

The controller 180 may perform different control or the same control depending on a type of a touch subject that touches the touch screen (or a touch key provided other than the touch screen). Whether to perform the different or the same control depending on the type of touch subject may be determined in accordance with an operating state of the current mobile terminal 100 or an application program that is being executed.

The touch sensor and the proximity sensor that are described above may, independently or in combination, sense various types of touches on the touch screen, such as a short (or tap) touch, a long touch, a multi touch, a drag touch, a flick touch, a pinch-in touch, a pinch-out touch, a swipe touch, or a hovering touch.

The ultrasonic sensor may recognize position information on a sensing object using an ultrasonic wave. The controller 180 may calculate a position of a wave generating source by using information sensed by the optical sensor and the plurality of ultrasonic sensors. The position of the wave generating source may be calculated using the property that light is much faster than the ultrasonic wave, that is, the time in which light reaches the optical sensor is much faster than the time in which the ultrasonic wave reaches the ultrasonic sensor. More specifically, the position of the wave generating source may be calculated using a time difference of the time of arrival of the ultrasonic wave with respect to light that serves as a reference signal.

As seen from the configuration of the input interface 120, the camera 122 includes at least one of a camera sensor (for example, a CCD and a CMOS), a photo sensor (or an image sensor), or a laser sensor.

The camera 122 and the laser sensor may be combined to sense a touch of a sensing object for a three-dimensional stereoscopic image. The photo sensor, which may be stacked on a display element, is configured to scan a motion of the sensing object proximate to the touch screen. More specifically, the photo sensor includes photo diodes and transistors (TR) in rows/columns so as to scan contents disposed on the photo sensor by using an electrical signal that changes in accordance with an amount of light applied to the photo diode. That is, the photo sensor calculates coordinates of the sensing object in accordance with a changed amount of light, and position information on the sensing object may be obtained through the coordinates.

The display 151 displays (outputs) information processed in the mobile terminal 100. For example, the display 151 may display execution screen information on an application program driven in the mobile terminal 100 and user interface (UI), or graphic user interface (GUI) information in accordance with the execution screen information.

Further, the display 151 may be configured as a stereoscopic display that displays a stereoscopic image.

A three-dimensional display type such as a stereoscopic type (a glass type), an autostereoscopic type (a glass-free type), and a projection type (a holographic type) may be applied to the stereoscopic display.

The sound output interface 152 may output audio data received from the wireless transceiver 110 or stored in the memory 170 in, for example, a call signal reception mode, a phone-call mode, a recording mode, a voice recognition mode, and a broadcasting reception mode. The sound output interface 152 may also output a sound signal (for example, a call signal reception sound and a message reception sound) related to a function performed in the mobile terminal 100. Such a sound output interface 152 may include, for example, a receiver, a speaker, and a buzzer.

The haptic module 153 may generate various tactile effects that the user may feel. A representative example of the tactile effect generated by the haptic module 153 may be vibration. For example, an intensity and pattern of the vibration generated in the haptic module 153 may be controlled by the selection of the user or a setting of the controller 180. For example, the haptic module 153 may compose different vibrations to output the composed vibrations, or sequentially output the different vibrations.

In addition to the vibration, the haptic module 153 may generate various tactile effects, such as effects by, for example, a pin arrangement that vertically moves to a contact skin surface, an injection force or a suction force of air through an injection port or a suction port, grazing on a skin surface, electrode contact, and stimulation of an electrostatic force or effects of reproducing a cold or hot sensation using a heat absorbing or heat emitting element.

The haptic module 153 may not only transmit a tactile effect by means of direct contact, but may also be implemented to allow the user to feel a tactile effect by muscular sensation of a finger or an arm. Two or more haptic modules 153 may be provided in accordance with a configuration aspect of the mobile terminal 100.

The optical output interface 154 outputs a signal for notifying occurrence of an event by using light from a light source of the mobile terminal 100. Examples of events generated in the mobile terminal 100 may include message reception, call signal reception, missed call, alarm, schedule notification, email reception, and information reception through an application.

The signal outputted from the optical output interface 154 is implemented as the mobile terminal emits single color or a plurality of color light on a front surface or a rear surface. When the mobile terminal senses the event confirmation of the user, the signal output may be completed.

The interface 160 serves as a passage with all external devices that are connected to the mobile terminal 100. The interface 160 receives data from the external device or is supplied with power from the external device to supply power to each component in the mobile terminal 100, or transmits data in the mobile terminal 100 to the external device. For example, the interface 160 may include, for example, a wired/wireless headset port, an external charger port, a wired/wireless data port, a memory card port, a port that connects a device equipped with an identification module, an audio input/output (I/O) port, a video input/output (I/O) port, and an earphone port.

The identification module is a chip in which various pieces of information for authenticating a usage right of the mobile terminal 100 is stored, and may include, for example, a user identity module (UIM), a subscriber identity module (SIM), and a universal subscriber identity module (USIM). A device (hereinafter, referred to as "identification device") equipped with the identification module may be manufactured as a smart card. Therefore, the identification device may be connected to the terminal 100 through the interface 160.

When the mobile terminal 100 is connected to an external cradle, the interface 160 may serve as a passage through which power is supplied from the cradle to the mobile terminal 100 or a passage through which various command signals inputted to the cradle by a user are transmitted to the mobile terminal 100. Various command signals or power inputted from the cradle may operate a signal for recognizing that the mobile terminal 100 is precisely mounted in the cradle.

The memory 170 may store a program for an operation of the controller 180, or temporarily store inputted/outputted data (for example, a phone book, a message, a still image, and a moving image). The memory 170 may store data related to vibrations or sounds of various patterns outputted when the touch is inputted onto the touch screen.

The memory 170 may include at least one type of storage medium of a flash memory type, a hard disk type, a solid state disk (SSD) type, a silicon disk drive (SDD) type, a multimedia card micro type, and card type memories (for example, SD or XD memory), a random access memory (RAM), a static random access memory (SRAM), a read-only memory (ROM), an electrically erasable programmable read-only memory (EEPROM), a programmable read only memory (PROM), a magnetic memory, a magnetic disk, or an optical disk. The mobile terminal 100 may operate in association with a web storage that performs a storage function of the memory 170 on the Internet.

As described above, the controller 180 may control an operation related to the application program and an overall operation of the mobile terminal 100. For example, when the state of the mobile terminal satisfies a predetermined condition, the controller 180 may execute or release a locking state that restricts an input of a control command of a user regarding the applications.

Further, the controller 180 may perform control and processing related to, for example, voice call, data communication, and video call, or may perform a pattern recognition process that may recognize a handwriting input or a picture drawing input performed on the touch screen as a text or an image, respectively. Moreover, the controller 180 may control any one or a combination of a plurality of components described above to implement various embodiments which will be described below, in the mobile terminal 100 according to the present disclosure.

Under the control of the controller 180, the power supply 190 is supplied with an external power or an internal power, and supplies power required for operating the components. The power supply 190 includes a battery, and the battery may be a chargeable embedded battery and be detachably coupled to a terminal body to be charged.

Further, the power supply 190 may include a connection port, and the connection port may be configured as one example of an interface 160 to which an external charger which supplies power to charge a battery is electrically connected.

As another example, the power supply 190 may be configured to wirelessly charge the battery without using the connection port. In this case, the power supply 190 may receive power from an external wireless power transmission device by using one or more of an inductive coupling scheme based on a self-induction phenomenon or a magnetic resonance coupling scheme based on an electromagnetic resonance phenomenon.

Various embodiments below may be implemented in a recording medium readable by a computer or a similar device using hardware, software, or a combination thereof, for example.

The display 151 displays (outputs) information processed in the mobile terminal 100. For example, the display 151 may display execution screen information on an application program driven in the mobile terminal 100 or user interface (UI) and graphic user interface (GUI) information in accordance with the execution screen information The display 151 may include at least one of a liquid crystal display (LCD), a thin film transistor liquid crystal display (TFT LCD), an organic light emitting diode (OLED), a flexible display, a three-dimensional display (3D display), or an electronic ink display (e-ink display).

Further, two or more displays 151 may be provided in accordance with an implementation type of the mobile terminal 100. In this case, a plurality of displays may be disposed to be spaced apart from each other or integrally disposed on one surface of the mobile terminal 100 or may be disposed on different surfaces.

The display 151 may include a touch sensor that senses a touch on the display 151 so as to receive the control command by the touch method. Therefore, when the touch is made on the display 151, the touch sensor senses the touch, and based on the touch, the controller 180 may generate a control command corresponding to the touch. Contents inputted by the touch method may be, for example, letters or numbers, or instructions or designated menu items in various modes.

The microphone 121 is configured to receive a voice of the user, or other sounds. The microphone 121 may be provided in a plurality of locations to receive stereo sounds.

The interface 160 serves as a passage through which the mobile terminal 100 is connected to the external device. For example, the interface 160 may be at least one of a connection terminal for connection with other devices (for example, an earphone or an external speaker), a port for near field communication (for example, an infrared port (IrDA port), a Bluetooth port, and a wireless LAN port) or a power supply terminal for supplying power to the mobile terminal 100. The interface 160 may be implemented as a socket type which accommodates an external card, such as a subscriber identity module (SIM), a user identity module (UIM), and a memory card for information storage.

At least one antenna for wireless communication may be provided in a terminal body. The antenna may be embedded in the terminal body or formed in a case. For example, the antenna which forms a part of the broadcast receiving module 111 (see FIG. 1) may be configured to be withdrawn from the terminal body. Alternatively, the antenna may be formed to be a film type to be attached onto an inner surface of a housing, or a case including a conductive material may serve as an antenna.

The terminal body includes the power supply 190 (see FIG. 1) which supplies power to the mobile terminal 100. The power supply 190 may be embedded in the terminal body, or may include a battery 191 which is configured to be detachable at the outside of the terminal body.

The battery 191 may be configured to be supplied with power through a power cable connected to the interface 160. Further, the battery 191 may be configured to be wirelessly chargeable by a wireless charging device. The wireless charging may be implemented by a self-induction scheme or a resonance scheme (magnetic resonance scheme).

An accessory which protects an outer appearance of the mobile terminal 100 or supports or extends the function thereof may be added to the mobile terminal 100. An example of the accessory may include a cover or a pouch which covers at least one surface of the mobile terminal 100 or accommodates the mobile terminal 100. The cover or the pouch may interwork with the display 151 to extend the function of the mobile terminal 100. Another example of the accessory may include a touch pen which supports or extends a touch input on the touch screen.

Figure 2A:
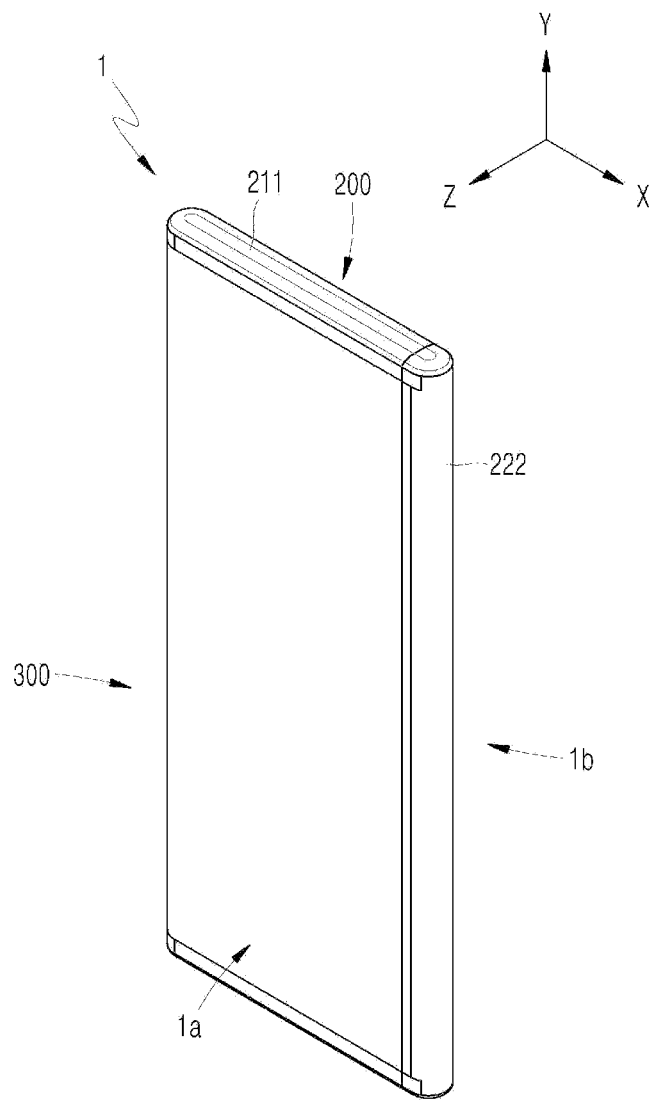
FIG. 2a is a perspective view illustrating a first state of a flexible display device.
Figure 2B:
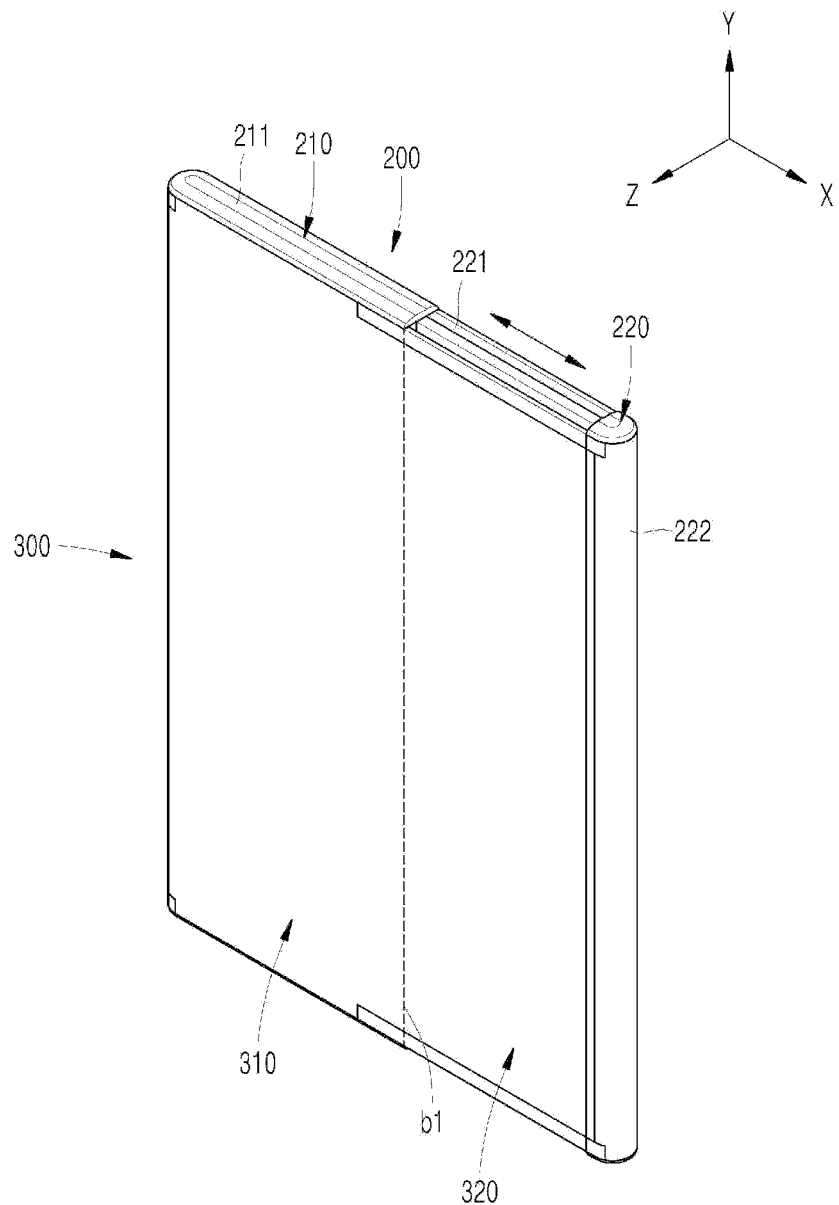
FIG. 2b is a perspective view illustrating a mode of a second state in which the flexible display device illustrated in FIG. 2a is transformed.

FIG. 2a is a perspective view illustrating a first state of a flexible display device 1. FIG. 2b is a perspective view illustrating a mode of a second state in which the flexible display device 1 illustrated in FIG. 2a is transformed.

Figure 3A:
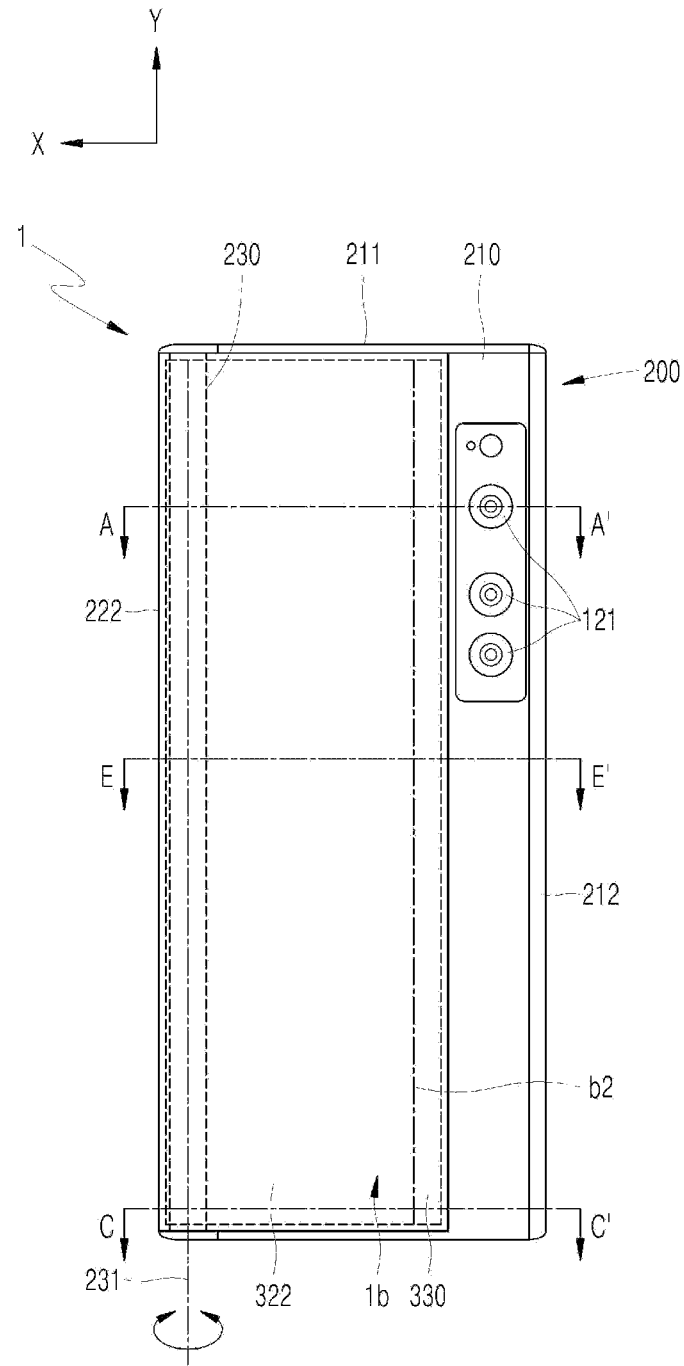
FIG. 3a is a bottom view illustrating the first state of the flexible display device.
Figure 3B:
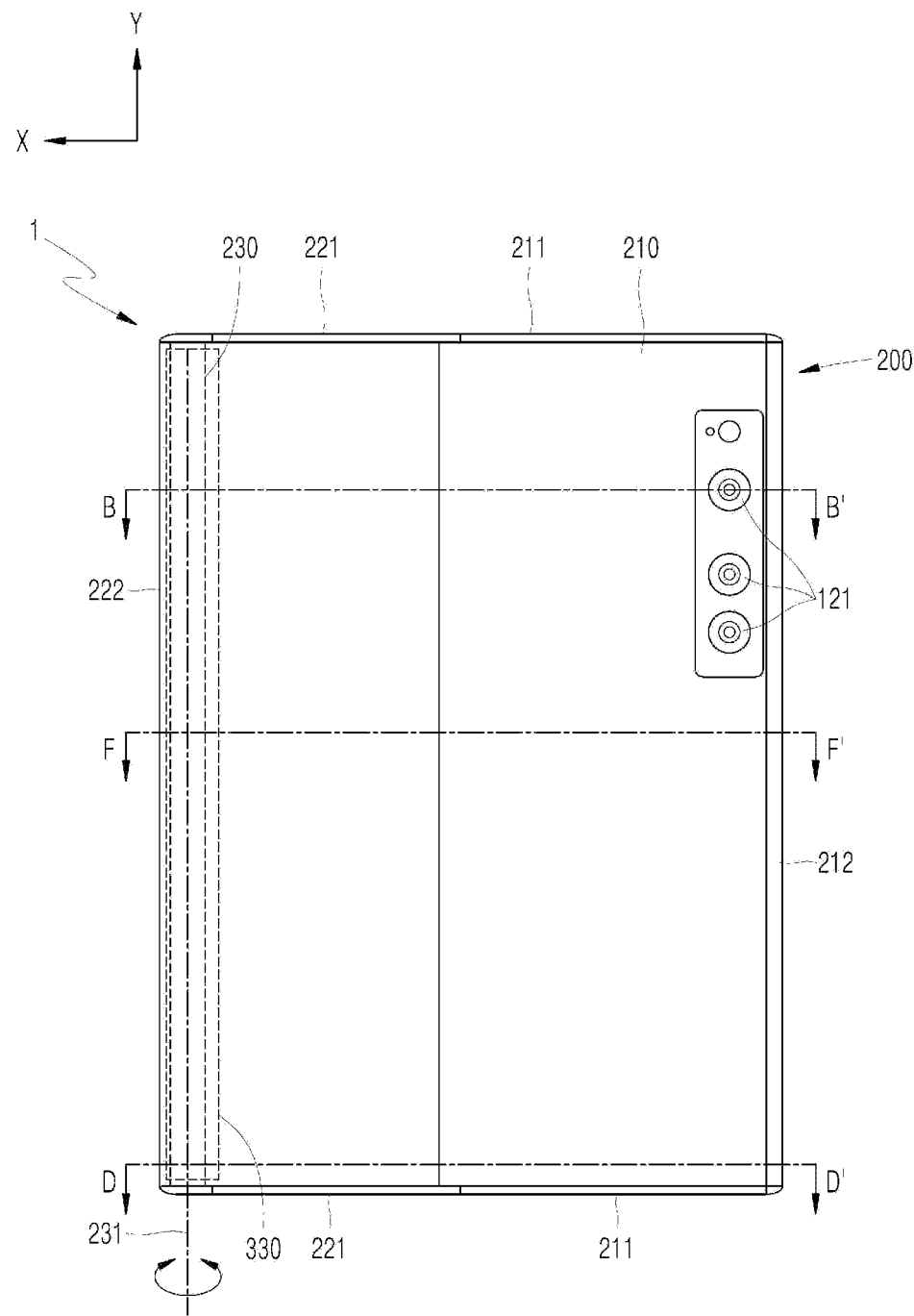
FIG. 3b is a bottom view illustrating the mode of the second state in which the flexible display device illustrated in FIG. 3a is transformed.

FIG. 3a is a bottom view illustrating the first state of the flexible display device 1. FIG. 3b is a bottom view illustrating the mode of the second state in which the flexible display device illustrated in FIG. 3a is transformed. In FIGS. 3a and 3b, a roller 230 and a flexible display 300 are illustrated with dotted lines.

The flexible display device 1 may be configured to include a body 200, a flexible display 300, and a camera 121. In addition, the body 200 may be configured to include a first body 210, a second body 220, and a roller 230.

In describing embodiments of the present invention, a first direction (X direction), a second direction (Y direction), and a third direction (Z direction) are directions orthogonal to each other.

The flexible display device 1 may be configured to include two surfaces 1a and 1b opposite to each other. The flexible display device 1 may be configured to include the first surface 1a and the second surface 1b, and a direction (a direction vertical or substantially vertical to the first surface 1a) faced by the first surface 1a and a direction (a direction vertical or substantially vertical to the second surface 1b) faced by the second surface 1b are opposite to each other.

In the flexible display device 1, the first surface 1a may be disposed to face the third direction (Z direction) and the second surface 1b may be disposed to face an opposite direction to the third direction (Z direction). If the first surface 1a is a front surface of the flexible display device 1, the second surface 1b becomes a rear surface of the flexible display device 1.

Hereinafter, except for a particularly limited case, it will be described that a front direction of the flexible display device 1 is set to the third direction (Z direction) and a rear of the display device 1 is set to the opposite direction to the third direction (Z direction).

The body 200 may form an overall shape of the display device 1. The body 200 may form a frame of the display device 1. The body 200 may be made of a comparatively hard material, and may be configured to include, for example, plastic, carbon, metal, or them. Other components constituting the display device 1 may be coupled to the body 200.

The body 200 may be formed in various forms which may support other components coupled thereto.

The body 200 may be formed in a flat form on the whole, or may be formed in a bent form such as the curved surface. The body may be a form in which an interior is filled on the whole, and may be a form in which a part is not filled.

As an example, when viewed from the front (Z direction), the body 200 may be formed in a rectangular form on the whole, and formed in the flat form on the whole.

The body 200 may be divided into two or more parts. The body 200 may be configured to include a first body 210 and a second body 220, and the first body 10 and the second body 220 may be configured to move relatively to each other (see FIGS. 2a, 2b, 3a, and 3b).

The second body 220 may be configured to slidably move and reciprocatively move relatively to the first body 210, and as a result, when viewed from the front (Z direction), an entire area occupied by the body 200 may be configured to be varied.

The second body 220 may configured to reciprocatively move between the first state and the second state relatively to the first body 210.

When viewed from the front (Z direction), the entire area (an area of the body 200 projected in the Z direction) occupied by the body 200 in the first state may be configured to be the smallest (see FIGS. 2a, 3a, etc.) and the entire area (an area of the body 200 projected in the Z direction) occupied by the body 200 in the second state may be configured to be the largest (see FIGS. 2*b*, 3*b*, etc.).

When viewed from the front (Z direction), an area where the first body 210 and the second body 220 are overlapped with each other in the first state may be configured to be the largest (see FIGS. 2*a*, 3*a*, etc.) and the area where the first body 210 and the second body 220 are overlapped with each other may be configured to be the smallest (see FIGS. 2*b*, 3*b*, etc.).

A movement direction of the second body 220 relatively to the first body 210 may be configured to be parallel to the first direction (X direction).

The first body 210 may be configured to have a predetermined length in the first direction (X direction) and also configured to have a predetermined length in the second direction (Y direction) orthogonal to the first direction.

The first body 210 may have a predetermined length in the third direction (Z direction) orthogonal to the first and second directions, but a length in the third direction is much smaller than lengths in the first and second directions. As a result, the first body 210 may be configured to be substantially flat in the first and second directions, but to be flat in the first and second directions.

The second body 220 may be configured to have a predetermined in the first and second directions. The second body 220 may have a predetermined length in the third direction, but the length in the third direction may be configured to be much smaller than the lengths in the first and second directions, and as a result, the second body 220 may be configured to be substantially flat in the first and second directions or to be flat in the first and second directions.

The first body 210 and the second body 220 may be formed as plate forms parallel to each other.

The body 200 may be configured to include a first frame 211, a second frame 212, a third frame 221, and a fourth frame 222 (see FIGS. 2*a*, 2*b*, 3*a*, and 3*b*).

The first frame 211 may be coupled to each of a second-direction end portion of the first body 210, and an opposite-direction end portion.

The second frame 212 may be coupled to the first body 210. The second frame 212 may cover a fourth area 340. The second frame 212 may include a light transparent material. An image of the fourth area 340 may be exposed to the outside through the second frame 212.

The third frame 221 may be coupled to each of a second-direction end portion of the second body 220, and an opposite-direction end portion.

A second-direction end portion of the fourth frame 222 and an opposite-direction end portion may be coupled to the third frame 221. The fourth frame 222 may cover a second area 320 which is bent over the roller 230. That is, in the first state, the fourth frame 222 may cover a first connection area 321. That is, in the second state, the fourth frame 222 may cover a second connection area 322.

The fourth frame 222 may include the light transparent material. An image of the second area 320 may be exposed to the outside through the fourth frame 222.

The roller 230 may be coupled to, formed in, or fixed to the second body 220. The roller 230 moves jointly with the second body 220 relatively to the first body 210.

The roller 230 may be provided inside the flexible display device 1.

The roller 230 allows the flexible display 300 to be bent and direction-switched. That is, the flexible display 300 formed in the first direction may be bent while forming the curved surface and extended in the opposite side to the first direction while passing through the roller 230.

The roller 230 may form a U-shaped or C-shaped path in which the flexible display 300 moves, or support an inner surface of the flexible display 300.

When the roller 230 is configured to have a form of supporting the inner surface of the flexible display 300, the roller 230 may elongate the second direction (Y direction).

A section of at least a part of the roller 230 may be configured to have a predetermined form in the second direction (Y direction). An outer circumferential surface of the roller 230 which faces or contacts the flexible display 300 may form the curved surface. The section of the roller 230 may have a form such as a circular shape, a semicircular shape, etc.

In an exemplary embodiment, the section of the roller 230 may have a predetermined cylindrical shape in the second direction (Y direction). In addition, the roller 230 may have a roller form which is rotatable bidirectionally around a central axis 231 parallel to the second direction. That is, the roller 230 may be coupled to the second body 220 in a form rotatable with the central axis 231 as a rotational axis.

Figure 4A:
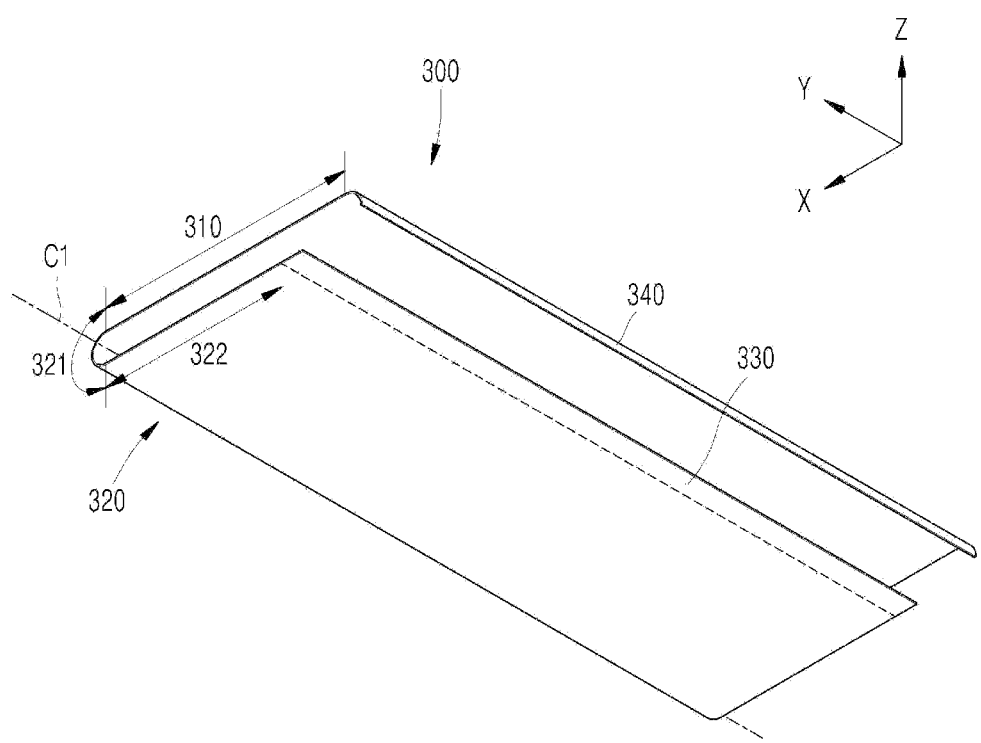
FIG. 4a is a perspective view illustrating a flexible display in the first state.
Figure 4B:
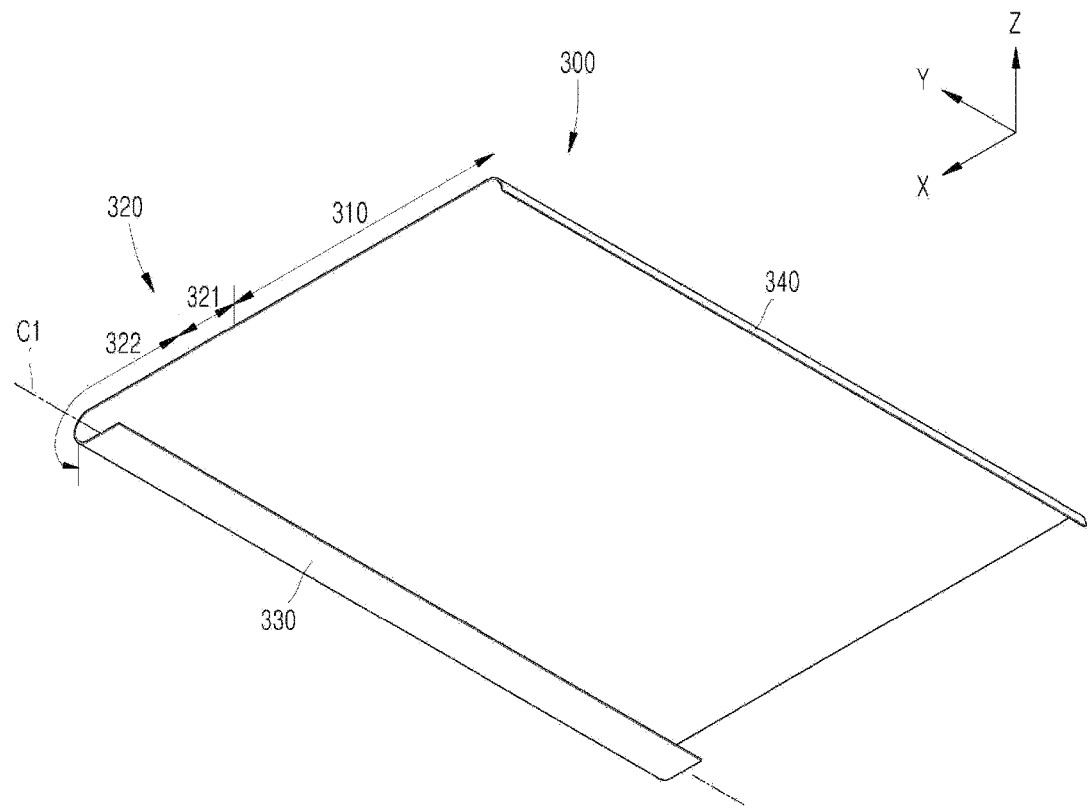
FIG. 4b is a perspective view illustrating a mode (the second state) in which the flexible display of FIG. 4a is transformed.

FIG. 4*a* is a perspective view illustrating a flexible display 300 in the first state. FIG. 4*b* is a perspective view illustrating a mode (the second state) in which the flexible display 300 of FIG. 4*a* is transformed. FIG. 4*a* may illustrate the mode in the first state and FIG. 4*b* may illustrate the mode in the second state.

The flexible display 300 may be configured like the display unit 151.

The flexible display 300 my have a thin film form, and includes an outer surface and an inner surface. The outer surface of the flexible display 300 is a surface facing the outside of the flexible display device 1 and the inner surface is a surface facing the inside of the flexible display device 1. The image is displayed in at least a part of the outer surface of the flexible display 300.

The flexible display 300 of which at least a part is bent is configured so that the form is transformed when the second body 220 moves relatively to the first body 210. When the first state is transformed to the second state, a middle part of the flexible display 300 is suspended on the roller 230, and the flexible display 300 is pushed by the roller and the form of the flexible display 300 is transformed.

The flexible display 300 may be configured to include a first area 310, a second area 320, and a third area 330 which are sequentially connected.

When the flexible display 300 is not coupled to the body 200 and unfolded flatly on the whole, all of the first area 310, the second area 320, and the third area 330 may form the same plane.

In FIG. 2*b*, a dotted line b1 is a virtual line indicating a boundary of the first area 310 and a first extension area 321.

The first area 310 may be coupled to the body 200 at any one side of the body 200 while forming a predetermined area. The first area 310 may be coupled to the first body 210, and fixed to the first body 210. That is, the first area 310 may be configured not to relatively move relatively to the first body 210.

The first area 310 may be configured to be parallel to the first and second directions. The first area 310 may be fixed to the front of the first body 210. The first area 310 may be fixed to the front of the first body 210 based on the third direction. The first area 310 and the first body 210 may be coupled parallel to each other.

In an exemplary embodiment of the present invention, the first area 310 may form the curved surface on the whole. In this case, a curvature of the first area 310 may be configured to be smaller than the curvature of the first connection area 321 to be described below, and a curvature radius of the first area 310 may be configured to be larger than the curvature radius of the first connection area 321.

The curvature radius of the first area 310 may be configured to be much larger than the curvature radius of the first connection area 321, and for example, when the curvature radius of the first connection area 321 is a, the curvature radius of the first area 310 may be configured to be 10*a or more.

In another embodiment of the present invention, the first area 310 may form the plane on the whole. The first area 310 may form the outer surface which is the plane, and may be placed on the front surface of the body 200. The section of the first area 310 may be configured to be constant in the first and second directions.

Hereinafter, the description will be made by premising that in the flexible display device 1, the first area 310 is formed by the plane.

The direction (the direction faced by the outer surface of the first area 310) faced by the first area 310 may be the third direction. The first area 310 may form the entirety or a part of the first surface Ta of the flexible display device 1.

The flexible display 300 may be configured to further include the fourth area 340.

The fourth area 340 may be extended from the first area 310 and may form an end portion of the flexible display 300. The section of the fourth area 340 may be configured to be constant in the second direction, and the fourth area 340 may form the curved surface, and the image may be displayed in the fourth area 340.

The second area 320 is extended from the first area 310, and a part is configured to be bent over the roller 230. The section of the second area 320 may be configured to be constant in the second direction.

The second area 320 may be configured to include the first connection area 321 and the second connection area 322.

The first connection area 321 may be directly connected to the first area 310, and the second connection area 322 may be directly connected to the first connection area 321 and the third area 330.

In the first state, the first connection area 321 forms the curved surface over the roller 230 along the outer circumferential surface of the roller 230. In the first state, the first connection area 321 may form the outer surface which is the curved surface around a curvature center line C1. The curvature center line C1 is a virtual straight line forming a center of curvature of the first connection area 321 in the first state, and is configured to be parallel to the second direction.

In the first state, the section of the first connection area 321 may form a semi circle.

The curvature center line C1 may match the central axis 231 of the roller 230.

In the second state, the curvature center line C1 may form a curvature center of the second connection area 322 forming the curved surface.

The image may be displayed in the first connection area 321 and the first area 310.

The area of the first area 310 may be configured to be larger than the area of the first connection area 321.

The second connection area 322 may form the outer surface which is the opposite surface to the first area 310 in the first state. That is, when the first area 310 faces the third direction (Z direction) in the first state, the second connection area 322 may facet the opposite direction to the third direction (Z direction). The image may be displayed in the connection area 322.

The second area 322 may form a part of the second surface 1b of the flexible display device 1.

The section of the second connection area 322 may be configured to be constant in the second direction. The section of the second connection area 322 may be configured to be constant in the first direction in the first state.

The flexible display 300 may be configured to be connected in an order of the first area 310, the first connection area 321, and the second connection area 322, and the first area 310, the first connection area 321, and the second connection area 322 may be configured in the U shape on the whole.

In an exemplary embodiment of the present invention, the second area 322 may form the curved surface on the whole in the first state. In this case, the curvature of the second connection area 322 may be configured to be smaller than the curvature of the first connection area 321, and the curvature radius of the second connection area 322 may be configured to be larger than the curvature radius of the first connection area 321.

The curvature radius of the second connection area 322 may be configured to be much larger than the curvature radius of the first connection area 321, and for example, when the curvature radius of the first connection area 321 is a, the curvature radius of the second connection area 322 may be configured to be 10*a or more.

In another embodiment of the present invention, the second connection area 322 may form the plane on the whole in the first state. In addition, the second connection area 322 may be configured to be parallel to the first area 310. Hereinafter, the description will be made by premising that in the flexible display device 1, the second connection area 322 is formed by the plane and configured to be parallel to the first area 310.

The third area 330 is extended from the second area 320 in the opposite side to the first area 310. The third area 330 may be configured to be extended from the second connection area 322 and may form an end portion of the flexible display 300.

In the flexible display 300, the image may be configured to be displayed on the surfaces of the first area 310, the second area 320, and the fourth area 340, and the image may be configured not to be displayed on the surface of the third area 330. In the flexible display 300, the third area 330 may form an extension portion of the substrate of the display 300, and form a dummy portion in which the image is not displayed.

The third area 330 may be coupled to the flexible display 300 apart from the flexible display 300 or may be integrated with the flexible display 300 in a manufacturing process of the flexible display 300. The third area 330 may be formed by the substrate of the flexible display 300.

The third area 330 may be formed in a plastic film form, and configured to be flexibly bent.

The camera 121 is fixed to the back surface of the body 200. The camera 121 may be coupled to the body 200 to face the opposite side to the third direction (Z direction).

The camera 121 may be fixed to the back surface of the first body 210.

The camera 121 may be fixed to the body 200 at a further side from the roller 230. That is, if the roller 230 is biased to a left side of the flexible display device 1 and coupled to the body 200, the camera 121 is biased to a right side of the flexible display device 1 and coupled to the body 200. The camera 121 may be adjacent and fixed to a corner of the first body 210 furthest from the roller 230. Two or more cameras 121 may be provided and arranged in the second direction.

Figure 5A:
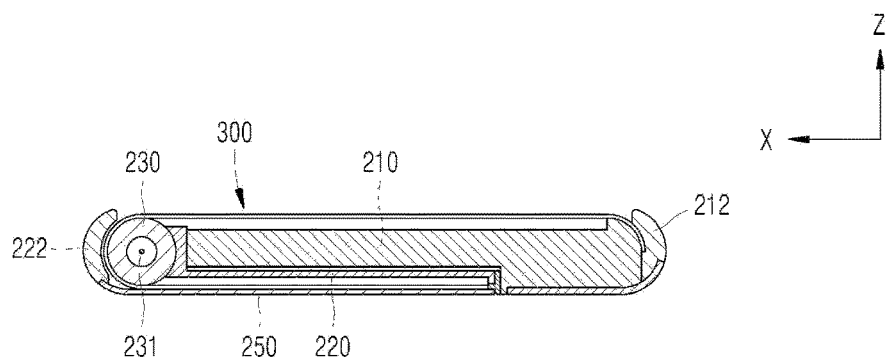

FIG. 5a is a cross-sectional view schematically illustrating the flexible display device 1 as a cross-sectional view taken along line A-A' of FIG. 3a.

Figure 5B:
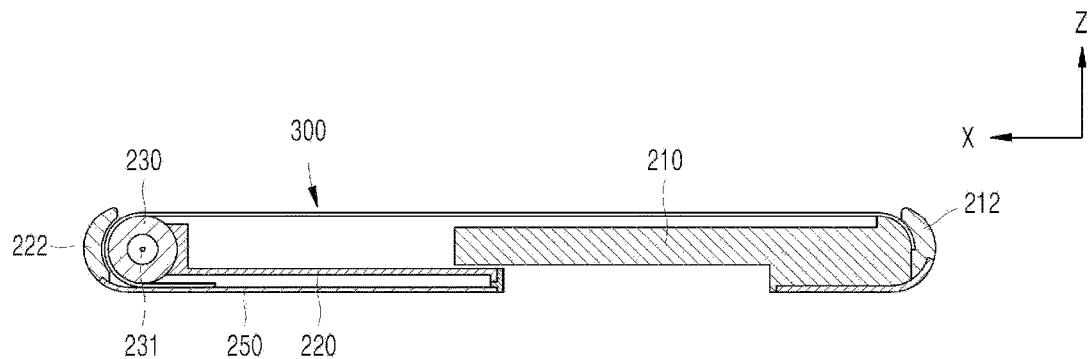
FIG. 5b is a cross-sectional view schematically illustrating the flexible display device as a cross-sectional view taken along line B-B' of FIG. 3b.

FIG. 5b is a cross-sectional view schematically illustrating the flexible display device 1 as a cross-sectional view taken along line B-B' of FIG. 3b. However, in FIGS. 5a and 5b, a form in which a cover 250 is additionally coupled to the flexible display device 1 is illustrated.

Figure 6A:
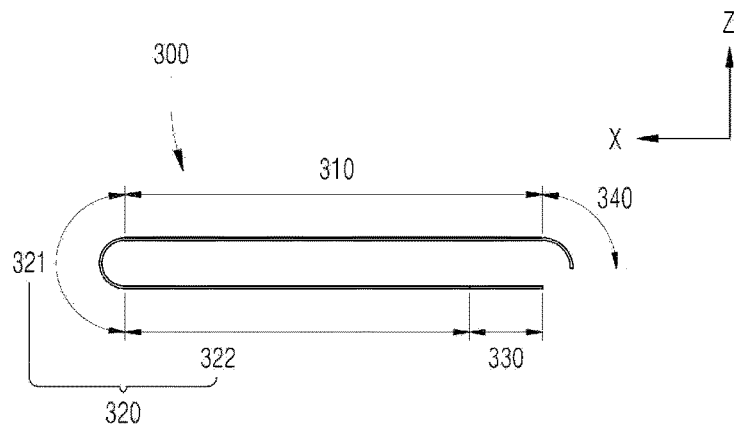
FIG. 6a is a cross-sectional view illustrating the flexible display of FIG. 5a, which is separated.
Figure 6B:
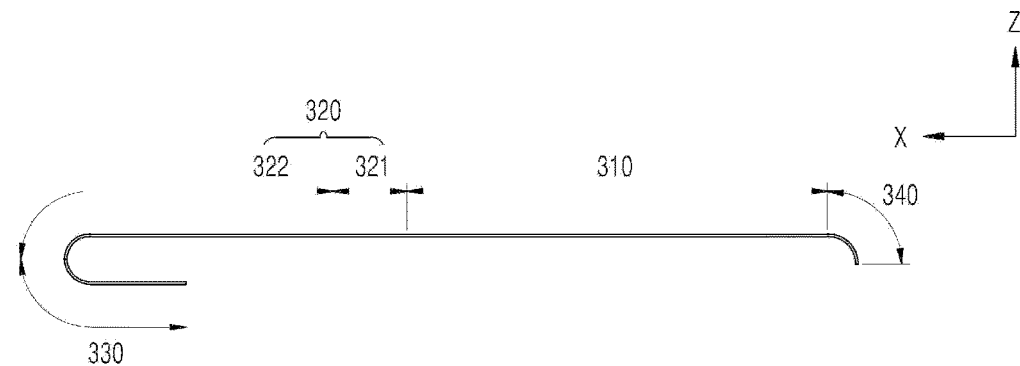
FIG. 6b is a cross-sectional view illustrating the flexible display of FIG. 5b, which is separated.

FIG. 6a is a cross-sectional view illustrating the flexible display 300 of FIG. 5a, which is separated. FIG. 6b is a cross-sectional view illustrating the flexible display 300 of FIG. 5b, which is separated.

The second body 220 may be configured to include the cover 250. The cover 250 may be configured in a plate form and may form the back surface of the second body 220.

The cover 250 may cover the flexible display 300 behind the second body 220. More specifically, the cover 250 covers the second area 320 and the third area 330 behind the second body 220. The front surface of the cover 250 is bonding-coupled to the second body 220, the third frame 221, and the fourth frame 222 along the edge based on the third direction.

The cover 250 may be formed by a light transparent panel. In the first state, the image of the second connection area 322 may be exposed to the outside through the cover 250.

The cover 250 is spaced apart from a rear surface of the second body 220 based on the third direction. When the first state and the second state are switched, the second surface 1b of the flexible display 300 moves between the rear surface of the second body 220 and the cover 250.

In the second state, the first connection area 321 may form the same plane as the first area 310, and at least a part of the second connection area 322 may form the curved surface in the circumferential direction of the roller 230. In the second state, a part of the second connection area 322 may form the same plane as the first area 310.

In the second state, the first connection area 321 may be positioned in front of the second body 220, and a part of the second connection area 322 may also be positioned in front of the second body 220.

A large portion of the second area 320 positioned behind in the first state may move to the front of the second body 220 in the second state, and the area of the second area 320 positioned in front of the second body 220 may be configured to be larger in the second state than in the first state.

In the second state, the third area 330 may be positioned behind the roller based on the third direction.

When the second body 220 reciprocatively moves between the first state and the second state relatively to the first body 210, the area of the flexible display 300 shown in the third direction (Z direction) may increase or decrease.

In the flexible display device 1, a projection area of the flexible display 300 is configured to be larger in the second state than in the first state when viewed in the third direction (Z direction).

When the second body 220 moves relatively to the first body 210 so as to switch the first state to the second state, the first connection area 321 may form the same plane as the first area 310, and a part of the second connection area 322 may be suspended on the roller 230 and may form a bent curved surface.

When the second body 220 moves relatively to the first body 210 so as to switch the second state to the first state, the first connection area 321 may form the curved surface over the roller 230 again and the second connection area 322 may form the plane parallel to the first area 310.

Figure 7A:
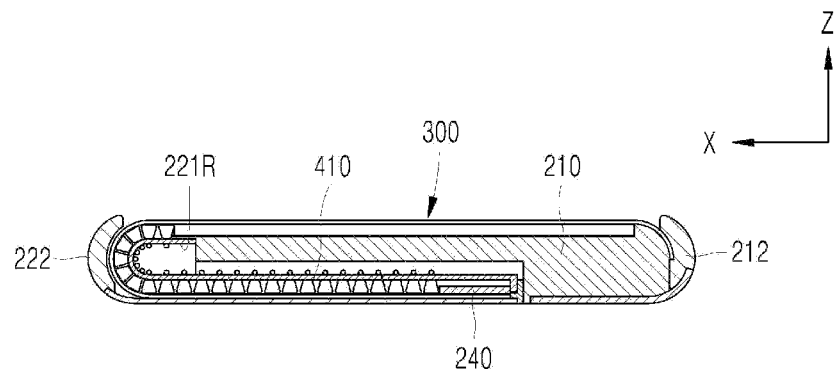
Figure 7B:
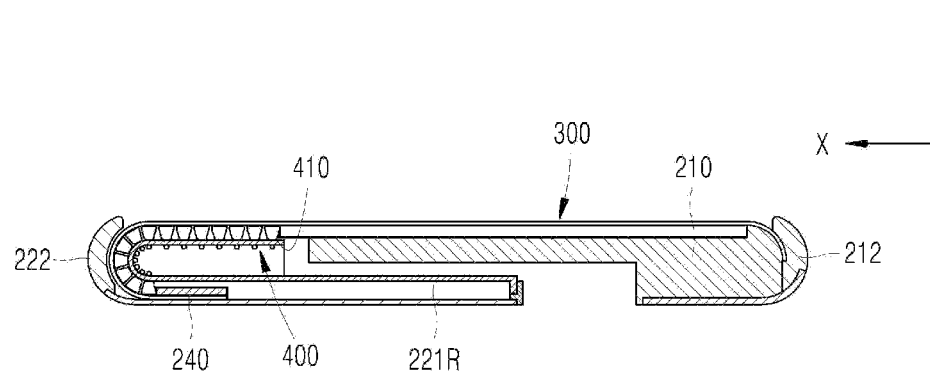
FIG. 7b is a cross-sectional view schematically illustrating the flexible display device as a cross-sectional view taken along line D-D' of FIG. 3b.

FIG. 7a is a cross-sectional view schematically illustrating the flexible display device 1 as a cross-sectional view taken along line A-A' of FIG. 3a. FIG. 7b is a cross-sectional view schematically illustrating the flexible display device 1 as a cross-sectional view taken along line D-D' of FIG. 3b.

A driving track 400 supports the second area 320 of the flexible display 300 inside the body 200. The driving track 400 is disposed to surround the roller 230. The driving track 400 may include multiple hinge fragments 410. The hinge fragments 410 may be sequentially hinge-coupled. The hinge fragments 410 may be attached to the flexible display 300.

A rail 221R is formed in the third frame 221. The rail 221R may be configured in a form such as a concave groove on the inner surface of the third frame 221. Both end portions of the driving track 400 are inserted into the rail 221R. When the first state and the second state are switched, the driving track 400 moves along the rail 221R.

The rail 221R is divided into a straight line section and a curve section. The straight line section is parallel to the first surface 1a and the second surface 1b. The curve section forms a semi-circle form around the central axis 231 of the roller 230. Both ends of the curve section are connected to the straight line sections. When the first state and the second state are switched, the driving track 400 supports the second area 320 of the flexible display 300 while moving along the rail 221R.

In the display device according to the exemplary embodiment of the present invention, the driving track 400 disposed to surround the roller 230 may apply predetermined tension without loosening on the whole. This may be adjusted by a total length of the driving track 400, whether a separate pulley is provided, etc.

The second body 5 may be configured to include a fifth frame 240. The fifth frame 240 is attached to the third area 330. Both end portions of the fifth frame 240 are inserted into the straight line section of the rail 221R. The straight line section is parallel to the second surface 1b. When the first state and the second state are switched, the fifth frame 240 supports the third area 330 of the flexible display 300 while moving along the rail 221R.

The flexible display 300 is spaced apart from the front surface of the cover 250 based on the third direction. When the first state and the second state are switched, the second surface 1b of the flexible display 300 moves while being spaced apart from the front surface of the cover 250 based on the third direction.

Figure 8A:
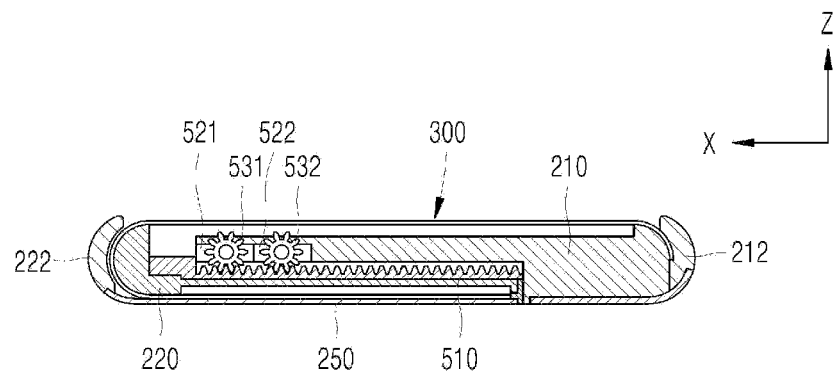
Figure 8B:
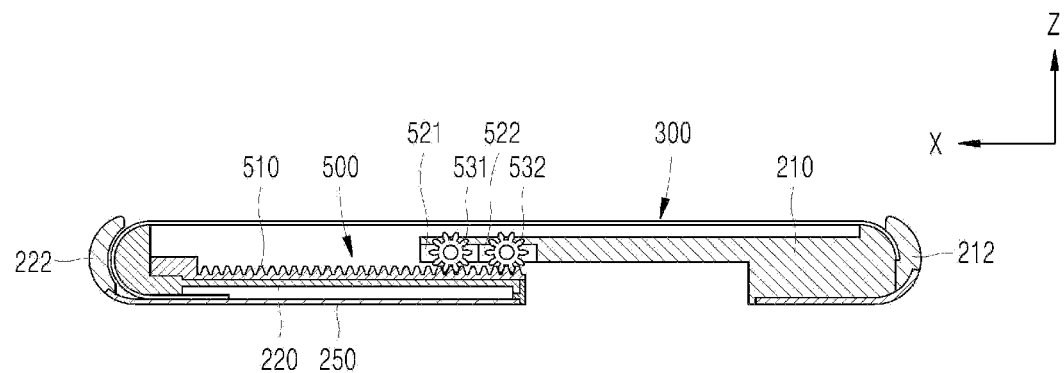
FIG. 8b is a cross-sectional view schematically illustrating the flexible display device as a cross-sectional view taken along line F-F' of FIG. 3b.

FIG. 8a is a cross-sectional view schematically illustrating the flexible display device 1 as a cross-sectional view taken along line E-E' of FIG. 3a. FIG. 8b is a cross-sectional view schematically illustrating the flexible display device 1 as a cross-sectional view taken along line F-F' of FIG. 3b.

When the first state and the second state are switched, a driving module 500 is configured to move the second body 220 relatively to the first body 210.

The driving module 500 is configured to include a rack 510, driving motors 521 and 522, and driving gears 531 and 532.

The deriving motors 521 and 522 are coupled to the first body 210. The driving gears 531 and 532 are coupled to the rotational axes of the driving motors 521 and 522. The driving gears 531 and 532 are rotated by the driving motors 521 and 522.

The driving gears 531 and 532 may be formed in a form such as a general gear, and the rack 510 is configured to straightly move while transferring rotational power of the driving motors 521 and 522 to the rack 510.

Gears are repeatedly formed along the outer surface in the driving gears 531 and 532, and the gears of the driving gears 531 and 532 are configured to engage with the gear of the rack 510.

The driving motors 521 and 522 may be configured in a general motor form rotated by electric energy, and configured as step motors. The driving motors 521 and 522 may be configured to be directly coupled to the driving gears 531 and 532 to rotate the driving gears 531 and 532 or rotate the driving gears 531 and 532 via another gear.

In the flexible display device 1 according to the exemplary embodiment of the present invention, each of the driving motors 521 and 522 and the driving gears 531 and 532 may be provided as one pair in forming one driving module 500.

One pair of driving motors 521 and 522 may be arranged in the first direction, and the rotational axis of each of the driving motors 521 and 522 may be configured to be parallel to the second direction.

The rack 510 is coupled to the second body 220. A gear tooth is repeatedly formed in a front and back direction. The rack 510 may be made of engineering plastic.

For example, the rack 510 may be made of polyacetal, polycarbonate, polyamide, or polyphenylene oxide, made of a combination thereof, or made to include polyacetal, polycarbonate, polyamide, polyphenylene oxide, and the combination. The rack 510 may be made of polyacetal for reducing friction and smooth driving in a relationship with the driving gears 531 and 532. The rack 510 is made as such to form the rack 510 having a delicate gear tooth.

Figure 9A:
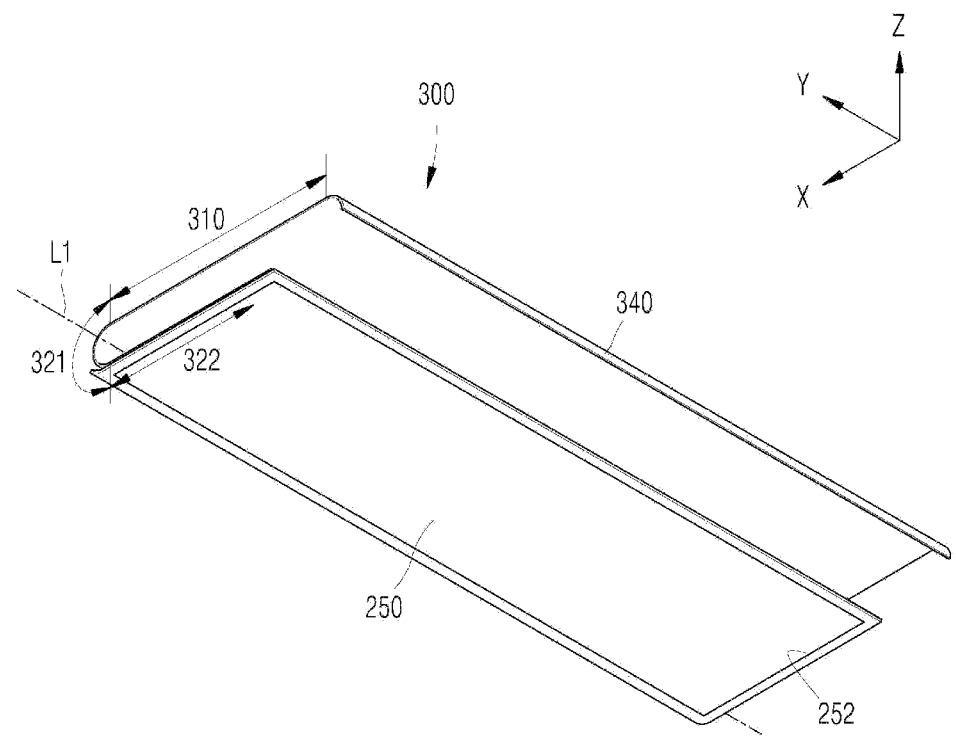
FIG. 9a is a perspective view illustrating a flexible display in the first state.
Figure 9B:
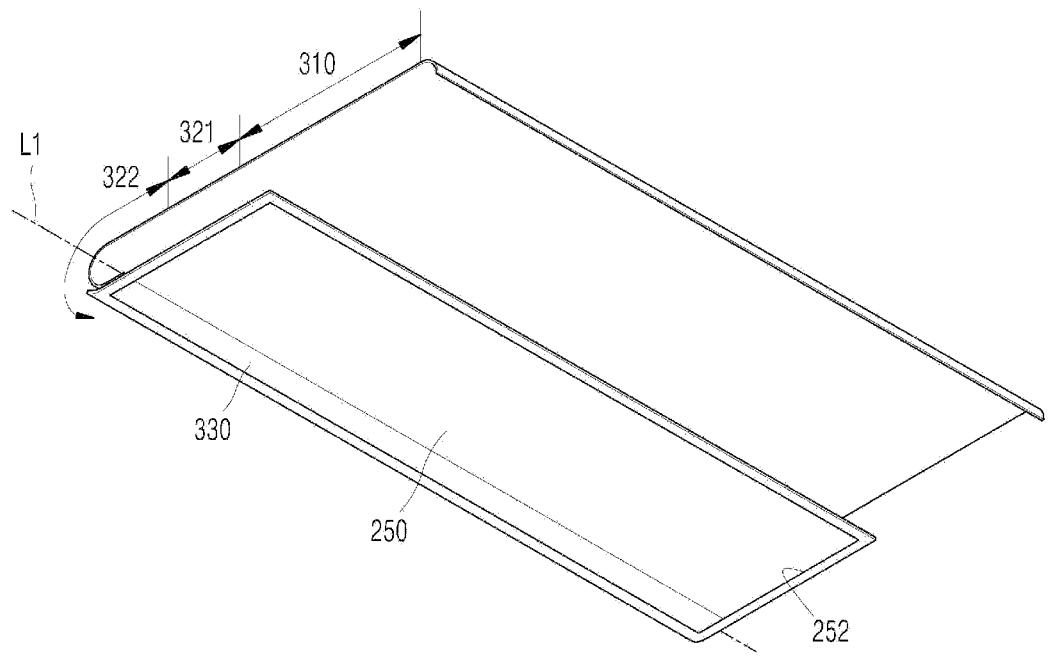
FIG. 9b is a perspective view illustrating a mode (the second state) in which the flexible display of FIG. 4a is transformed jointly with the cover.

FIG. 9a is a perspective view illustrating the flexible display 300 and the cover 250 in the first state. FIG. 9b is a perspective view illustrating a mode (the second state) in which the flexible display 300 of FIG. 4a is transformed jointly with the cover 250.

The cover 250 includes a black material (BM) printing layer 252. The BM printing layer 252 is formed along the edge of the front surface of the cover 250 based on the third direction. The BM printing layer 252 blocks the transmission of light. Therefore, light (image) of the flexible display 300 passes through the cover 250 only in an area other than the BM printing layer 252, i.e., an area inside the BM printing layer 252.

The inner surface of the cover 250 is spaced apart from the rear surface of the second body 220 based on the third direction. When the first state and the second state are switched, the second area 320 and the third area 330 of the flexible display 300 move between the rear surface of the second body 220 and the front surface of the cover 250.

The flexible display 300 is spaced apart from the front surface of the cover 250 based on the third direction. When the first state and the second state are switched, the second surface 1b of the flexible display 300 moves while being spaced apart from the front surface of the cover 250 based on the third direction.

Figure 10A:
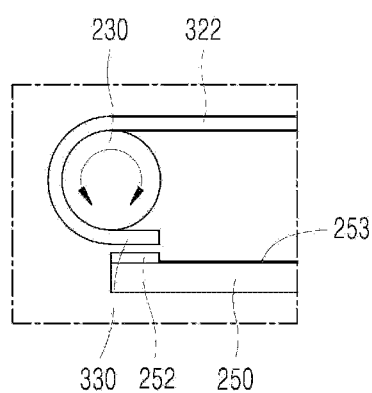
FIG. 10a is a diagram schematically illustrating a left part of FIG. 5b.
Figure 10B:
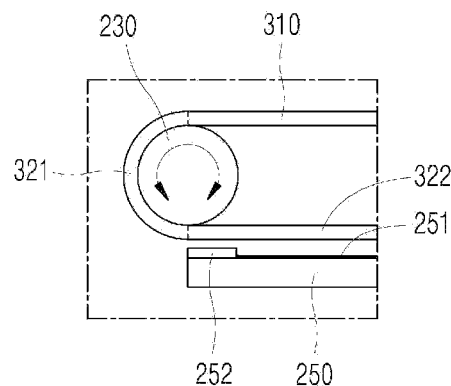
FIG. 10b as a diagram schematically illustrating the left part of FIG. 5a is a diagram illustrating a state in which tensile force acts on the flexible display.

FIG. 10a is a diagram schematically illustrating a left part of FIG. 5b. FIG. 10b as a diagram schematically illustrating the left part of FIG. 5a is a diagram illustrating a state in which tensile force acts on the flexible display 300.

Figure 10C:
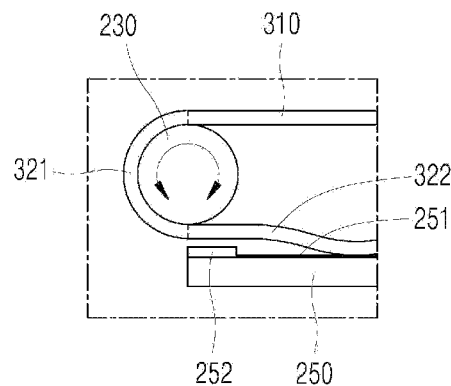
FIG. 10c as a diagram schematically illustrating the left part of FIG. 5a is a diagram illustrating a state in which compression force acts on the flexible display.

FIG. 10c as a diagram schematically illustrating the left part of FIG. 5a is a diagram illustrating a state in which compression force acts on the flexible display 300.

The first area 310 may be fixed to the first body 210. The third area 330 is configured to be extended from the second connection area 322 and forms an end portion of the flexible display 300. The third area 330 is not fixed to the second body 220.

When the first state is switched to the second state, the first body 210 and the second body 220 are estranged from each other. In this process, the first area 310 fixed to the first body 210 is estranged from the roller 230, and pulled tensile force acts on the second area 320 and the third area 330 not fixed to the second body 220 (see FIG. 10b).

When the second state is switched to the first state, the first body 210 and the second body 220 are close to each other. In this process, the first area 310 fixed to the first body 210 is close to the roller 230, and pushing force, i.e., the compression force acts on the second area 320 and the third area 330 not fixed to the second body 220. When the compression force acts on the second area 320 and the third area 330, a small amount of flexion is generated in the second area 320 and the third area 330 (see FIG. 10c).

Therefore, when the second state is switched to the first state, the second area 320 and the third area 330 may contact the front surface of the cover 250 based on the third direction. In this case, damage (scratch) due to the friction with the cover 250 may be generated in the second area 320 and the third area 330.

The size of the compression force which acts on the second area 320 and the third area 330 is associated with rotational speed increase rates of the driving motors 521 and 522. That is, when the second state is switched to the first state, as the movement speed of the second body 220 quickly increases, the compression force increases while inertial force which acts on the second area 320 and the third area 330 becomes larger.

When the second state is switched to the first state, if the rotational speeds of the driving motors 521 and 522 do not quickly increase, the compression force which acts on the second area 320 and the third area 330 may not exceed a predetermined level.

The controller 180 may control the rotational speeds of the driving motors 521 and 522 to gradually increase when the second body 220 moves toward the first body 210. In this case, damage (scratch) due to the friction with the cover 250 may be generated in the second area 320 and the third area 330.

Manufacturers of the flexible display device 1 perform anti fingerprint (AF) coating for a cover in order to prevent the damage to the flexible display. The AF coating represents excellent anti scratch and a kinetic friction efficient (slip property). Therefore, the damage to the flexible display 300 may be prevented.

In general, a black matrix (BM) printing layer is formed in the cover of the flexible display. The BM printing layer 252 blocks the transmission of light. Therefore, light (image) of the flexible display 300 passes through the cover 250 only inside the BM printing layer 252. The BM printing layer 252 is formed along the edge of the front surface of the cover 250 based on the third direction.

The cover 250 is bonding-coupled to the body 200 of the flexible display device 1 along the BM printing layer 252. An AF coating layer has weak bonding coupling force. Therefore, the AF coating layer should not be formed in the BM print layer 252.

A conventional AF coating layer forming scheme of the cover is a scheme that prints a mask on the BM print layer, and then performs the AF coating for the mask, and peels the mask. However, a mask printing and peeling process generates an additional yield, which acts as a factor of raising a production unit price of the cover. Further, there is a problem in that the BM print layer is partially damaged upon mask printing.

Another conventional AF coating layer forming scheme of the cover is a scheme that forms the mask on the BM print layer through photolithography, and then performs the AF coating for the mask, and peels a dry-film resists (DFR) film.

However, complicated processes such as DFM film Lami, exposure, development, peeling processes, etc., are required, which act as the factor of raising the production unit price. Further, there is a problem in that both the BM print layer and the AF coating layer are peeled due to the use of a strong alkaline corrosion solution upon DFR peeling.

A cover manufacturing method (S100) of the flexible display device 1 according to the exemplary embodiment of the present invention is to present a method that may solving the problems of the conventional cover manufacturing method.

Figure 11:
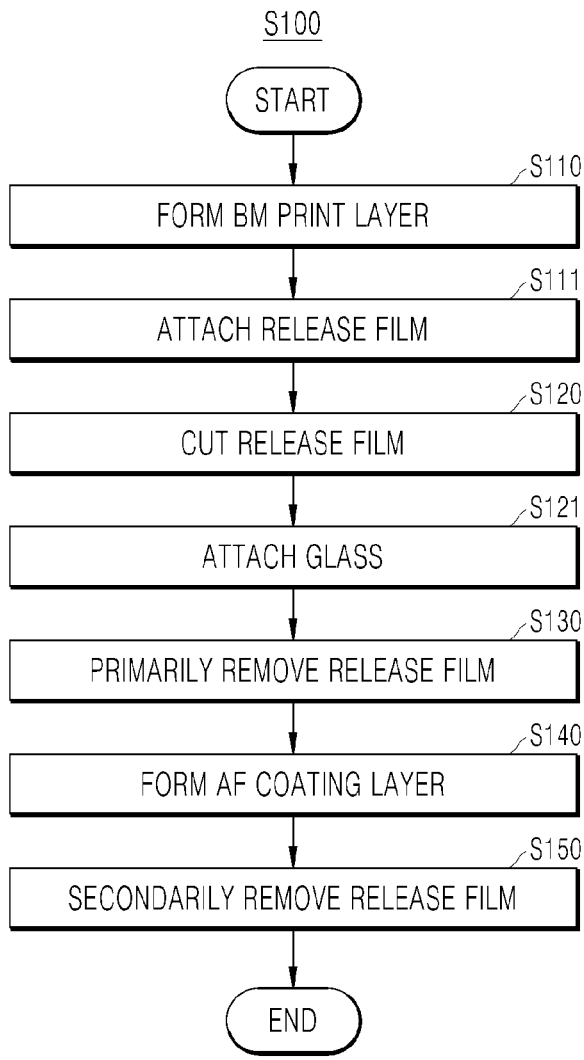
FIG. 11 is a flowchart illustrating a cover manufacturing method of a flexible display device.
Figure 12A:
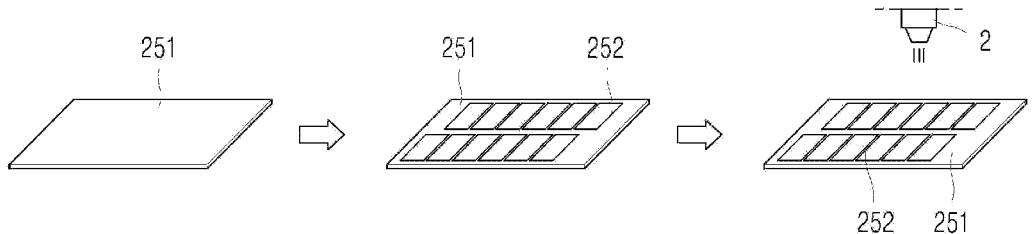
FIG. 12a is a conceptual view illustrating steps (a) and (b) of the cover manufacturing method of the flexible display device of FIG. 11.

FIG. 11 is a flowchart illustrating a cover manufacturing method (S100) of a flexible display device 1. FIG. 12a is a conceptual view illustrating steps (a) and (b) of the cover manufacturing method (S100) of the flexible display device 1 of FIG. 11.

Figure 12B:
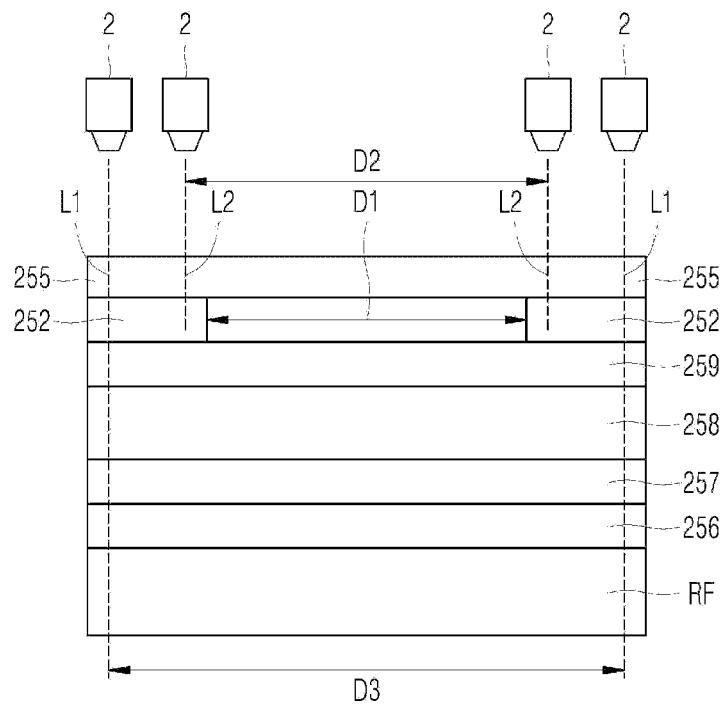
FIG. 12b is a conceptual view illustrating step (a) of the cover manufacturing method of the flexible display device 1 of FIG. 11.

FIG. 12b is a conceptual view illustrating step (a) of the cover manufacturing method (S100) of the flexible display device 1 of FIG. 11.

The cover manufacturing method (S100) of the flexible display device 1 according to the exemplary embodiment of the present invention includes step (a), step (b), step (c), step (d), and step (e).

The cover 250 includes the transparent film 251, the BM printing layer 252, the abrasion-resistant coating layer 253, and a glass 254.

Step (a) is a step of forming the BM printing layer on the front surface of the transparent film 251 (S110) and attaching the release film 255 (S111).

The transparent film 251 may be formed by a DECO film. The DECO film is a film manufactured by expressing various decoration designs on the surface of a plastic film.

The transparent film 251 may implement a design through a UV pattern, Non-Conductive Vacuum Metallization (NCVM), printing, etc. in a PET film 258. In the cover 250, the PET film 258 serves to prevent scattering to prevent user damage even though the glass 254 is broken.

The transparent film 251 may include a release film (RF), an optically clear adhesive (OCA) film 256, an optical film 257, the PET film 258, and a tint layer 259 (when listed from the film attached to the glass 254).

In step (a), two or more BM printing layers 252 are formed on the front surface of the transparent film 251 (S110). Preferably, in step (a), multiple BM printing layers 252 may be formed on the front surface of a large transparent film 251 (S110).

When multiple BM printing layers 252 are formed on the front surface of the large transparent film 251 (S110), a production time of steps (a) and (b) may be shortened. Therefore, it is advantageous in terms of a production yield of the cover manufacturing process. Each BM printing layer 252 forms a closed strip form.

When the transparent film 251 is attached to the glass 254 (S121), the BM printing layer 252 is disposed along the edge of the cover 250. Therefore, the BM printing layer 252 may have various sizes and forms which depend on the size and the form of the cover 250. As an example, the BM printing layer 252 provided in the rectangular cover 250 may form a strip form closed in a rectangular form.

In step (a), the release film 255 attached to the front surface of the transparent film 251 (S111) forms a form to cover multiple BM printing layers 252.

When step (a) is completed, step (b) is initiated. Step (b) is a step of cutting the release film 255 along the BM printing layer 252 (S120).

A laser processing apparatus 2 is used for cutting the release film 255 (S120). The laser processing apparatus 2 is an apparatus that performs processing such as cutting, hole drilling, welding, etc., of a material by using a laser beam. The laser processing apparatus 2 is an apparatus used in the existing cover manufacturing process. Therefore, in step (b), the existing process and equipment are usable as they are without adding supply chain management (SCM).

Figure 12C:
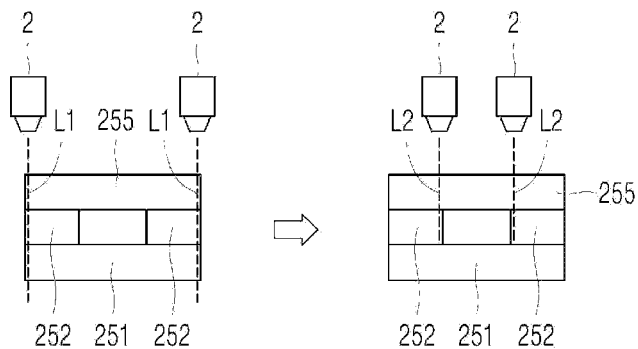
FIG. 12c is a conceptual view illustrating step (b) of the cover manufacturing method of the flexible display device 1 of FIG. 11.

FIG. 12c is a conceptual view illustrating step (b) of the cover manufacturing method (S100) of the flexible display device 1 of FIG. 11.

Step (b) includes step (b1) and step (b2).

Step (b1) is a step of forming a first cutting line L1 in the release film 255 along the BM printing layer 252. The first cutting line L1 forms a closed strip form. The first cutting line L1 may be formed along an outer edge of the BM printing layer 252.

An interval D1 between the BM printing layers 252 is smaller than an interval D3 between the first cutting lines L1 based on sections (see FIG. 12b) of multiple split transparent films 251 and release films 255.

In step (b1), the first cutting line L1 penetrates the release film 255, and the laser cuts both the BM printing layer 252 and the transparent film 251. Therefore, in step (b1), the large transparent film 251 and the release film are split into multiple films for each BM printing layer 252. Borders of multiple split transparent films 251 and release films 255 match a border of the BM printing layer.

Step (b2) is a step of forming a second cutting line L2 in the release film 255 along the BM printing layer 252. The second cutting line L2 forms the closed strip form. The second cutting line L2 may be formed along an inner edge of the BM printing layer 252.

The second cutting line L2 is positioned inside the first cutting line L1. The interval D3 between the first cutting lines L1 is larger than an interval D2 between the second cutting lines L1 based on the sections (see FIG. 12b) of multiple split transparent films 251 and release films 255.

In addition, the interval D1 between the BM printing layers 252 is smaller than the interval D2 between the second cutting lines L2 based on the sections (see FIG. 12b) of multiple split transparent films 251 and release films 255.

As described above, the cover 250 is bonding-coupled to the second body 220, the third frame 221, and the fourth frame 222 of the flexible display device 1 along the edge of the BM printing layer 252.

The cover 250 and the second body 220 are bonding-coupled by the adhesive layer. The adhesive layer forming bonding-coupling force is formed along the outer edge of the BM printing layer 252. The abrasion-resistant coating layer 253 may be formed by the AF coating. The AF coating layer shows a high slip property.

The bonding-coupling force of the abrasion-resistant coating layer 253 is weak. Therefore, the second cutting line L2 is positioned at a location which is away from the adhesive layer, i.e., a location close to the inner edge of the BM printing layer 252.

The second cutting line L2 does not penetrate the release film 255. Therefore, the release film 255 is not separate based on the second cutting line L2 while external force is not applied. Therefore, when step (b2) is completed, the BM printing layer 252 is interposed between the second cutting line L2 and the transparent film 251.

Depths of the first cutting line L1 penetrating the release film 255, the BM printing layer 252, and the transparent film 251 and the second cutting line L2 not penetrating the release film 255 may be controlled by adjusting a laser output of the laser processing apparatus 2. The laser output of the laser processing apparatus 2 may be easily adjusted by software installed in the laser processing apparatus 2.

Figure 13A:
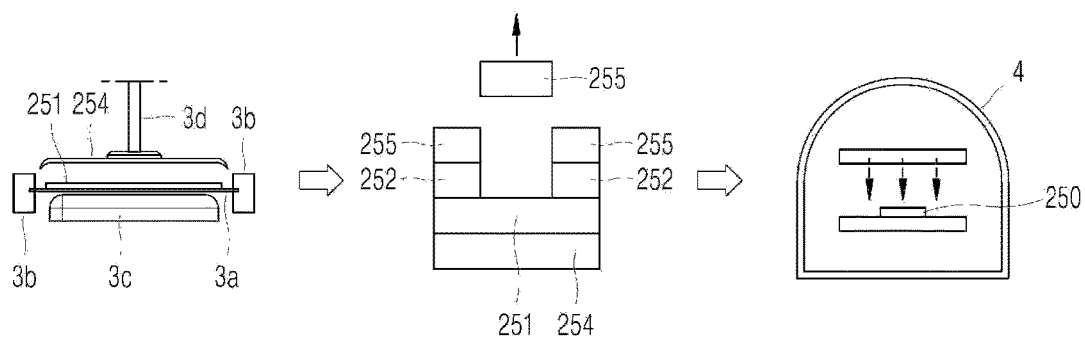
FIG. 13a is a conceptual view illustrating steps (a) and (b) of the cover manufacturing method of the flexible display device of FIG. 11.

FIG. 13a is a conceptual view illustrating steps (c) and (d) of the cover manufacturing method (S100) of the flexible display device 1 of FIG. 11.

When step (b) is completed, the glass 254 is attached to the back surface of the transparent film 251 (S121). The transparent film 251 is placed on a guide film 3a. The release film 255 is positioned between the transparent film 251 and the guide film 3a. The edge of the guide film 3a is fixed to a clamp 3b. The guide film 3a is seated on an upper surface of a silicon pad 3c while being fixed to the clamp 3b (see FIG. 13a).

The glass 254 moves to an upper side of the transparent film 251 by an adsorption pad 3d. When the glass 254 moves downward, the transparent film 251 is attached to an upper surface of the glass 254 based on the third direction (S121).

When the release film (RF) is removed, the transparent film 251 is attached to the glass 254 by adhesive force of the OCA film 256. The OCA film 256 as an inorganic material type may maintain high transmittance even though the OCA film 256 is coupled to a counter object such as an optical film acryl, PC, glass, etc.

When step (c) is completed, step (c) is initiated. Step (c) is a step of removing the release film 255 attached to the front surface of the transparent film 251 (S130) (see FIG. 13a).

FIGS. 12b and 12c as schematic views illustrate that the release film 255 is spaced apart from the front surface of the transparent film 251 by the BM printing layer 252. However, the BM printing layer 252 has a thickness less than 10 um, while the interval D1 between the BM printing layers 252 is at least several cm. In addition, the release film 255 is manufactured by a flexible synthetic resin material. Therefore, actually, the release film 255 is attached to the front surface of the transparent film 251.

In step (c), the release film 255 attached to the front surface of the transparent film 251 is cut along the second cutting line L2. In this state, the release film 255 attached to the BM printing layer 252 maintains an attached state. When the release film 255 attached to the front surface of the transparent film 251 is removed (S130), the front surface of the transparent film 251 is exposed to the upper side between the BM printing layers 252.

When step (c) is completed, step (d) is initiated. Step (d) is a step of forming the abrasion-resistant coating layer 253 on the front surface of the transparent film 253 (S140). The abrasion-resistant coating layer 253 may be formed by the AF coating.

The AF coating is performed by vacuum deposition or sputtering.

Vacuum deposition includes resistance heating type vacuum deposition using a molybdenum or tungsten boat, vacuum deposition using an E-beam, etc. The sputtering includes a scheme of thermal sputtering in an AF coating dedicated machine.

A leftmost side of FIG. 13a schematically illustrates a vacuum deposition apparatus 4 or a sputtering apparatus. The vacuum deposition apparatus 4 or the sputtering apparatus is an apparatus used in the existing cover manufacturing process. Therefore, in step (d), the existing process and equipment are usable as they are without adding supply chain management (SCM).

Figure 13B:
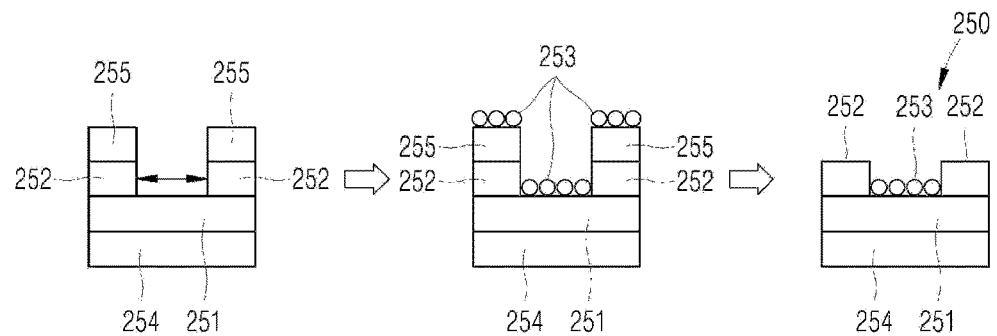
FIG. 13b is a conceptual view illustrating steps (d) and (e) of the cover manufacturing method of the flexible display device 1 of FIG. 11.

FIG. 13b is a conceptual view illustrating steps (d) and (e) of the cover manufacturing method (S100) of the flexible display device 1 of FIG. 11.

In step (d), the abrasion-resistant coating layer 253 is formed on the front surface of the transparent film 251 and the front surface of the release film 255 attached to the BM printing layer 252 (S140). The abrasion-resistant coating layer 253 has a thickness of several to dozens of nms on the front surface of the transparent film 251 and the front surface of the release film 255.

When step (d) is completed, step (e) is initiated. Step (e) is a step of removing the release film 255 attached to the BM printing layer 252. That is, in step (e), the release film 255 attached between the first cutting line L1 and the second cutting line L2 is removed (S150).

When the release film 255 attached between the first cutting line L1 and the second cutting line L2 is removed (S150), the BM printing layer 252 forms a form to surround the abrasion-resistant coating layer 253.

Thereafter, the cover 250 is bonding-coupled to the second body 220, the third frame 221, and the fourth frame 222 of the flexible display device 1 along the BM printing layer 252. The cover 250 and the second body 220 may be bonding-coupled by the adhesive layer. The adhesive layer is formed along the edge of the BM printing layer 252.

When the cover 250 is bonding-coupled to the second body 220, the third frame 221, and the fourth frame 222 of the flexible display device 1, the abrasion-resistant coating layer 253 is interposed between the transparent film 251 and the back surface of the second body 220 (see FIG. 10b).

The second cutting line L2 is positioned at a location which is closer to the inner edge of the BM printing layer 252 than to the adhesive layer. Therefore, the abrasion-resistant coating layer 253 is not formed at an outer edge portion of the BM printing layer 252 in which the adhesive layer is formed.

Further, until the cover 250 is bonding-coupled to the second body 220, the third frame 221, and the fourth frame 222 of the flexible display device 1, the outer edge portion of the BM printing layer 252 in which the adhesive layer is formed is fully protected by the release film 255.

Therefore, the cover manufacturing method (S100) of the flexible display device 1 according to the exemplary embodiment of the present invention is configured to include step (a), step (b), step (c), step (d), and step (e) to solve the problem in the related art in which the BM printing layer 252 is damaged upon mask peeling, and both the BM printing layer 252 and the abrasion-resistant coating layer 253 are peeled upon DFR peeling.

Further, in the cover manufacturing method (S100) of the flexible display device 1 according to the exemplary embodiment of the present invention, the existing process and equipment are usable without adding supply chain management (SCM) in step (a), step (b), step (c), step (d), and step (e) to solve the problem in the related art in which the production unit price of the cover is raised by generating an additional yield due to additional processes such as mask forming and peeling, DFR peeling, etc.

Hereinabove, a specific embodiment of the present invention is described and illustrated, but the present invention is not limited to the disclosed embodiment, and it may be appreciated by those skilled in the art that the exemplary embodiment can be variously modified and transformed to another specific embodiment without departing from the spirit and the scope of the present invention. Therefore, the scope of the present invention will not be defined by the described embodiment, but defined by the technical spirit disclosed in the claims.

INDUSTRIAL APPLICABILITY

By a flexible display device and a method for manufacturing a cover therefor according to an exemplary embodiment of the present invention, in that physical and chemical transformation of a BM printing layer and an abrasion-resistant coating layer are blocked to prevent coupling force between a cover and a body from being weakened due to damage to the BM printing layer and minimize damage (scratch) to the flexible display, a possibility of only using a related art, but marketing or business of an applied apparatus is sufficient by exceeding a limit of the existing technology, and the present invention can be realistically apparently carried out, so the flexible display device and the method for manufacturing a cover therefor are an invention which has an industrial applicability.

The invention claimed is:

1. A flexible display device comprising:
a body including a first body, a second body slidably moving relatively to the first body, and a roller coupled to the second body;
a flexible display of which a part is fixed to a front of the first body and which is bent behind the second body over the roller; and
a cover covering the flexible display behind the second body, and having an abrasion-resistant coating layer formed on a surface facing the second body,
wherein a BM printing layer is formed on a surface of the cover facing the second body,
wherein the BM printing layer surrounds the abrasion-resistant coating layer,
wherein the cover includes:
a glass transmitting light; and
a transparent film between the glass and both the BM printing layer and the abrasion-resistant coating layer, and
wherein the transparent film includes a PET film preventing scattering of the glass.

2. The flexible display device of claim 1, wherein the BM printing layer forms a closed strip form.

3. The flexible display device of claim 1, wherein the transparent film includes
an optically clear adhesive (OCA) film attached to the glass,
an optical film interposed between the PET film and the OCA film, and
a tint layer formed on a surface of the PET film facing the second body.

4. The flexible display device of claim 1, wherein the flexible display includes
a first area fixed to a front of the first body,
a second area which is extended from the first area and of which a part is bent over the roller, and
a third area extended from the second area at an opposite side to the first area, and
the cover covers the second area and the third area.

5. The flexible display device of claim 4, further comprising:
a driving module moving the second body relatively to the first body,
wherein the driving module includes
a driving motor coupled to the first body,
a rack coupled to the second body, and
a driving gear rotated by the driving motor and engaged with the rank,
wherein a rotational speed of the driving motor gradually increases when the second body moves toward the first body to minimize compression force which acts on the second area and the third area.

* * * * *